US009520775B2

(12) United States Patent
Sugimura

(10) Patent No.: US 9,520,775 B2
(45) Date of Patent: Dec. 13, 2016

(54) BOOSTING SYSTEM, DIAGNOSING METHOD, AND COMPUTER READABLE MEDIUM STORING DIAGNOSING PROGRAM FOR DIAGNOSING THE BOOSTING FUNCTIONS OF A BOOSTING SECTION

(75) Inventor: Naoaki Sugimura, Tokyo (JP)

(73) Assignee: LAPIS Semiconductor Co., Ltd., Tokyo (JP)

( * ) Notice: Subject to any disclaimer, the term of this patent is extended or adjusted under 35 U.S.C. 154(b) by 876 days.

(21) Appl. No.: 13/346,942

(22) Filed: Jan. 10, 2012

(65) Prior Publication Data

US 2012/0181994 A1 Jul. 19, 2012

(30) Foreign Application Priority Data

Jan. 17, 2011 (JP) .................................. 2011-007187

(51) Int. Cl.
  *G05F 1/10* (2006.01)
  *H02M 3/07* (2006.01)
  *G01R 19/165* (2006.01)
  *G01R 31/00* (2006.01)

(52) U.S. Cl.
  CPC .............. *H02M 3/07* (2013.01); *G01R 19/165* (2013.01); *G01R 31/00* (2013.01); *G05F 1/10* (2013.01)

(58) Field of Classification Search
  CPC .......... H02M 3/07; H02M 3/073; H02M 3/18; G05F 1/10; G01R 19/165; G01R 31/00
  USPC ....... 363/59–60; 327/536–538; 307/109–107
  See application file for complete search history.

(56) References Cited

U.S. PATENT DOCUMENTS

| 6,100,837 A | 8/2000 | Takeuchi | |
|---|---|---|---|
| 6,184,726 B1 * | 2/2001 | Haeberli | G11C 5/145 327/307 |
| 6,717,829 B2 | 4/2004 | Appeltans | |
| 6,741,118 B2 * | 5/2004 | Uchikoba | H02M 3/07 327/537 |
| 7,733,178 B1 * | 6/2010 | Delano | H03F 1/0244 330/207 A |

(Continued)

FOREIGN PATENT DOCUMENTS

| JP | 2000-125586 A | 4/2000 |
|---|---|---|
| JP | 2010-097549 A | 4/2010 |

OTHER PUBLICATIONS

The First Office Action issued by the Chinese Patent Office on Mar. 16, 2015, which corresponds to Chinese Patent Application No. 201110441399.3 and is related to U.S. Appl. No. 13/346,942.

*Primary Examiner* — Gustavo Rosario Benitez
(74) *Attorney, Agent, or Firm* — Studebaker & Brackett PC

(57) ABSTRACT

The present invention provides a boosting system, a diagnosing method and a diagnosing program, that may diagnose a boosting section while suppressing consumption of electric power and current, and without being carrying out by a CPU. Namely, during an initializing operation, difference between power supply voltage and own threshold voltage charges capacitor C1 of a comparison circuit, and a difference between voltage of a constant voltage and the own threshold voltage charges capacitor C2. In a comparing operation, a boosting section and the capacitor C1 are connected so that boosted voltage is inputted, and GND and the capacitor C2 are connected so that GND voltage is inputted. At this time, if output OUT is L level, it is diagnosed that there is no defect, whereas if the output OUT is H level, it is diagnosed that there is defect.

18 Claims, 18 Drawing Sheets

(56) References Cited

U.S. PATENT DOCUMENTS

| | | | |
|---|---|---|---|
| 2001/0019269 A1* | 9/2001 | Yudahira | 324/426 |
| 2006/0214648 A1* | 9/2006 | Liu | H02M 3/157 |
| | | | 323/222 |
| 2007/0008028 A1* | 1/2007 | Kawai | 327/536 |
| 2009/0066338 A1* | 3/2009 | Yonezawa | 324/426 |
| 2010/0214836 A1* | 8/2010 | Honda | 365/185.2 |

* cited by examiner

BOOSTING SYSTEM, DIAGNOSING METHOD, AND COMPUTER READABLE MEDIUM STORING DIAGNOSING PROGRAM FOR DIAGNOSING THE BOOSTING FUNCTIONS OF A BOOSTING SECTION

CROSS-REFERENCE TO RELATED APPLICATION

This application claims priority under 35 USC 119 from Japanese Patent Application No. 2011-007187 filed on Jan. 17, 2011, the disclosure of which is incorporated by reference herein.

BACKGROUND OF THE INVENTION

Field of the Invention

The present invention relates to a boosting system, a diagnosing method, and a computer readable medium storing a diagnosing program. In particular, the present invention relates to a boosting system, a diagnosing method, and a computer readable medium storing a diagnosing program, that carry out self-diagnosis of a boosting section.

Description of the Related Art

Boosting circuits, that generate boosted voltage obtained by boosting the power supply voltage of a power supply such as a battery cell or the like, are generally known. There are devices and methods for diagnosis of the boosting circuits.

For example, Japanese Patent Application Laid-Open (JP-A) No. 2000-125586 discloses a diagnosis method and device that are applied to a boosting circuit that generates the driving power supply of high-side switching elements of a reversible motor drive circuit. In JP-A No. 2000-125586, diagnosing of defect of the boosting circuit is carried out by a CPU comparing a boosted voltage VS and a voltage that is twice a power supply potential $V_{VB}$.

On the other hand, a chopper-type comparator, that is disclosed in JP-A No. 2010-97549 and that connects capacitors in parallel, is known as a comparison circuit (comparator)

However, in the technique disclosed in JP-A No. 2000-125586, in order to compare the boosted voltage VS and the voltage that is twice the power supply potential $V_{vB}$ at the CPU, the CPU may be occupied by diagnosis, and may cause delays in other process.

Further, when the boosted voltage VS is AD-converted and inputted to the CPU, it is connected to GND at a constant voltage value, and voltage division must be carried out by using a dividing resistor. Therefore, at the time of the voltage division, electric power from the power supply line that is connected to GND is consumed. Further, detection current must be made to flow to the resistance element of the dividing resistor. However, in order to suppress consumption of the boosted output current, that is outputted from the boosting circuit, in the diagnosing of defect, the resistance value of the resistance element must be made to be as large as possible. However, there are limits to the resistance value that can be obtained, and the boosted output current that is consumed in order to diagnose defect cannot be made to be less than or equal to the current that is limited by the resistance value.

SUMMARY OF THE INVENTION

The present invention provides a boosting system, a diagnosing method and a diagnosing program, that may diagnose the boosting function of a boosting section appropriately while suppressing consumption of electric power and current, and without carrying out comparing operations by a CPU.

A first aspect of the present invention is a boosting system including: a boosting section that generates a boosted voltage obtained by boosting a first voltage in accordance with a second voltage outputted from a constant voltage circuit; and a comparison circuit that compares a difference value between the boosted voltage and the first voltage, and a difference value between the second voltage and ground potential, and outputs results of comparison, or that compares a difference value between the boosted voltage and the second voltage, and a difference value between the first voltage and ground potential, and outputs results of comparison.

In a second aspect of the present invention, in the above-described first aspect, the comparison circuit may include: a single inverting amplifier; a first capacitor and a second capacitor, that are connected in parallel to an input of the single inverting amplifier; a first switching element that connects the first capacitor and the boosting section such that the first voltage is inputted; a second switching element that connects the first capacitor and the boosting section such that the boosted voltage is inputted; a third switching element that connects and the second capacitor and the boosting section such that the second voltage is inputted; a fourth switching element that connects the second capacitor to ground such that the ground potential is inputted; and a fifth switching element that short-circuits the input and an output of the single inverting amplifier.

A third aspect of the present invention is a diagnosing method including, in the boosting system according to the second aspect: switching the first switching element ON and connecting the first capacitor and the boosting section, and applying a difference between the first voltage and an own threshold voltage of the single inverting amplifier to the first capacitor, in a state in which the fifth switching element is ON and the input and the output of the single inverting amplifier are short-circuited; switching the third switching element ON and connecting the second capacitor and the boosting section, and applying a difference between the second voltage and the own threshold voltage of the single inverting amplifier to the second capacitor, in a state in which the fifth switching element is ON and the input and the output of the single inverting amplifier are short-circuited; switching the second switching element ON and connecting the first capacitor and the boosting section, in a state in which the fifth switching element is OFF; and switching the fourth switching element ON and connecting the first capacitor to the ground, in a state in which the fifth switching element is OFF.

A fourth aspect of the present invention is a computer readable medium storing a diagnosing program for causing a computer to execute a process for self-diagnosing the boosting section of the boosting system according to the second aspect 2, the process including: switching the first switching element ON and connecting the first capacitor and the boosting section, and applying a difference between the first voltage and an own threshold voltage of the single inverting amplifier to the first capacitor, in a state in which the fifth switching element is ON and the input and the output of the single inverting amplifier are short-circuited; switching the third switching element ON and connecting the second capacitor and the boosting section, and applying a difference between the second voltage and the own threshold voltage of the single inverting amplifier to the second capacitor, in a state in which the fifth switching element is ON and the input and the output of the single inverting amplifier are short-circuited; switching the second switching element ON and connecting the first capacitor and the boosting section, in a state in which the fifth switching element is OFF; and switching the fourth switching element ON and connecting the first capacitor to the ground, in a state in which the fifth switching element is OFT.

In accordance with the above aspects, the present invention may appropriately diagnose the boosting function of a boosting section while suppressing consumption of electric power and current, and without carrying out comparing operations by a CPU.

BRIEF DESCRIPTION OF THE DRAWINGS

Exemplary embodiments of the present invention will be described in detail based on the following figures, wherein.

DETAILED DESCRIPTION OF THE INVENTION

First Exemplary Embodiment

First, a boosting system of a first exemplary embodiment, that is the basic structure of the present invention, is described in detail hereinafter with reference to the drawings.

Figure 1:
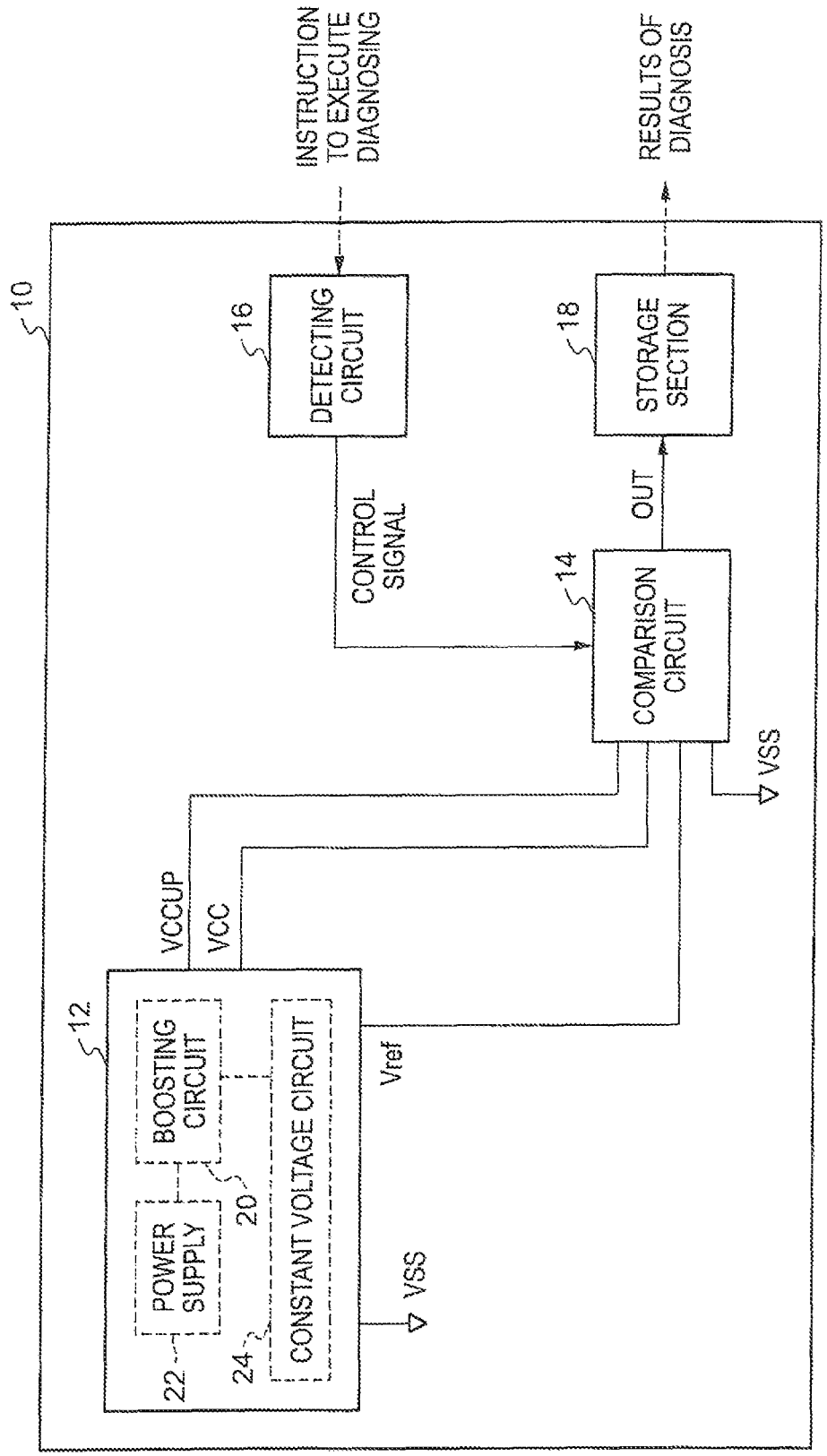
FIG. 1 is a schematic structural drawing showing the schematic structure of a boosting system according to a first exemplary embodiment.

First, the structure of the boosting system of the present exemplary embodiment is described. A schematic structural drawing of an example of the schematic structure of the boosting system of the present exemplary embodiment is shown in FIG. 1. A boosting system 10 of the present exemplary embodiment shown in FIG. 1 is structured to include a boosting section 12, a comparison circuit 14, a detecting circuit 16 and a storage section 18. The boosting system 10 of the present exemplary embodiment self-diagnosis the defect in a boosting circuit 20 of the boosting section 12.

The boosting section 12 is structured to include the boosting circuit 20, a power supply 22, and a constant voltage circuit 24. The boosting circuit 20 generates and outputs boosted voltage VCCUP that is obtained by boosting power supply voltage VCC of the power supply 22 in accordance with constant voltage Vref generated at the constant voltage circuit 24.

The comparison circuit 14 compares inputted voltage values, and outputs output OUT (a logic value expressing H level or L level) that is the results of comparison. In the present exemplary embodiment, as an example, the comparison circuit 14 is structured by a chopper-type comparator 14 (details described hereinafter).

The detecting circuit 16 is a logic circuit that detects (diagnoses) defect with the boosting circuit 20 on the basis of the output OUT that is outputted from the comparison circuit 14. When the detecting circuit 16 receives, from the exterior, an instruction to execute diagnosis, the detecting circuit 16 outputs control signals that control the ON/OFF states of respective switching elements (details described hereafter) that are provided at the comparison circuit 14.

The storage section 18 stores the output OUT (the logic value expressing H level or L level) that is outputted from the comparison circuit 14. A register or the like is an example of the storage section 18. In the present exemplary embodiment, diagnosis of the boosting circuit 20 is carried out on the basis of the logic value stored in the storage section 18.

Figure 2:
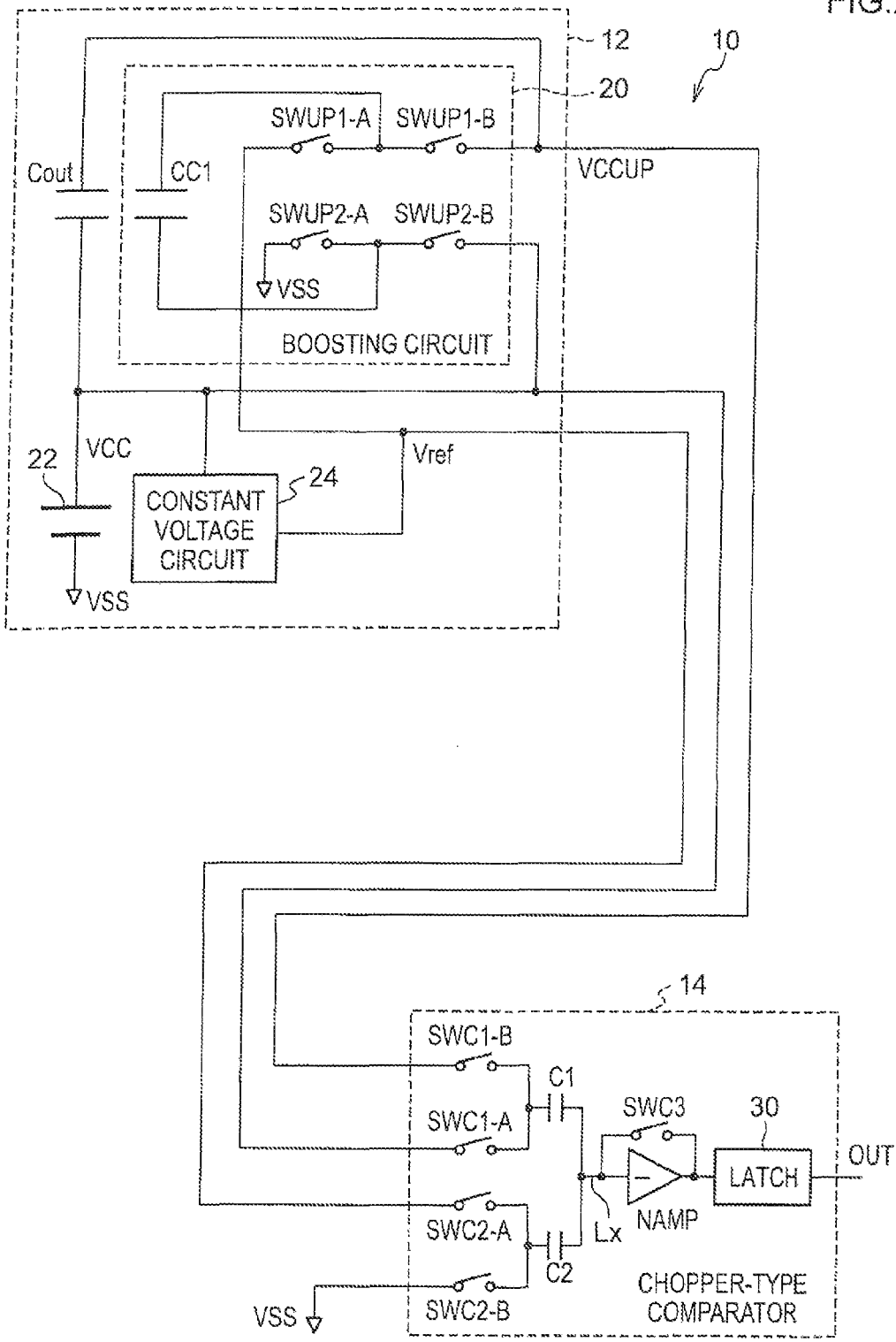
FIG. 2 is a circuit diagram showing the schematic structure of the boosting system according to the first exemplary embodiment.

A circuit diagram of an example of the schematic structure of the boosting system 10 of the present exemplary embodiment is shown in FIG. 2. Note that illustration of the detecting circuit 16 and the storage section 18 is omitted from FIG. 2.

As shown in FIG. 2, the boosting section 12 of the present exemplary embodiment includes the boosting circuit 20, the power supply 22 of the power supply voltage VCC, the constant voltage circuit 24, and a capacitor Cout.

The constant voltage circuit 24 of the present exemplary embodiment generates the constant voltage Vref by using the power supply voltage VCC. Further, the boosting circuit 20 includes a capacitor CC1 and switching elements SWUP1-A, SWUP2-A, SWUP1-B, SWUP2-B.

Figure 3:
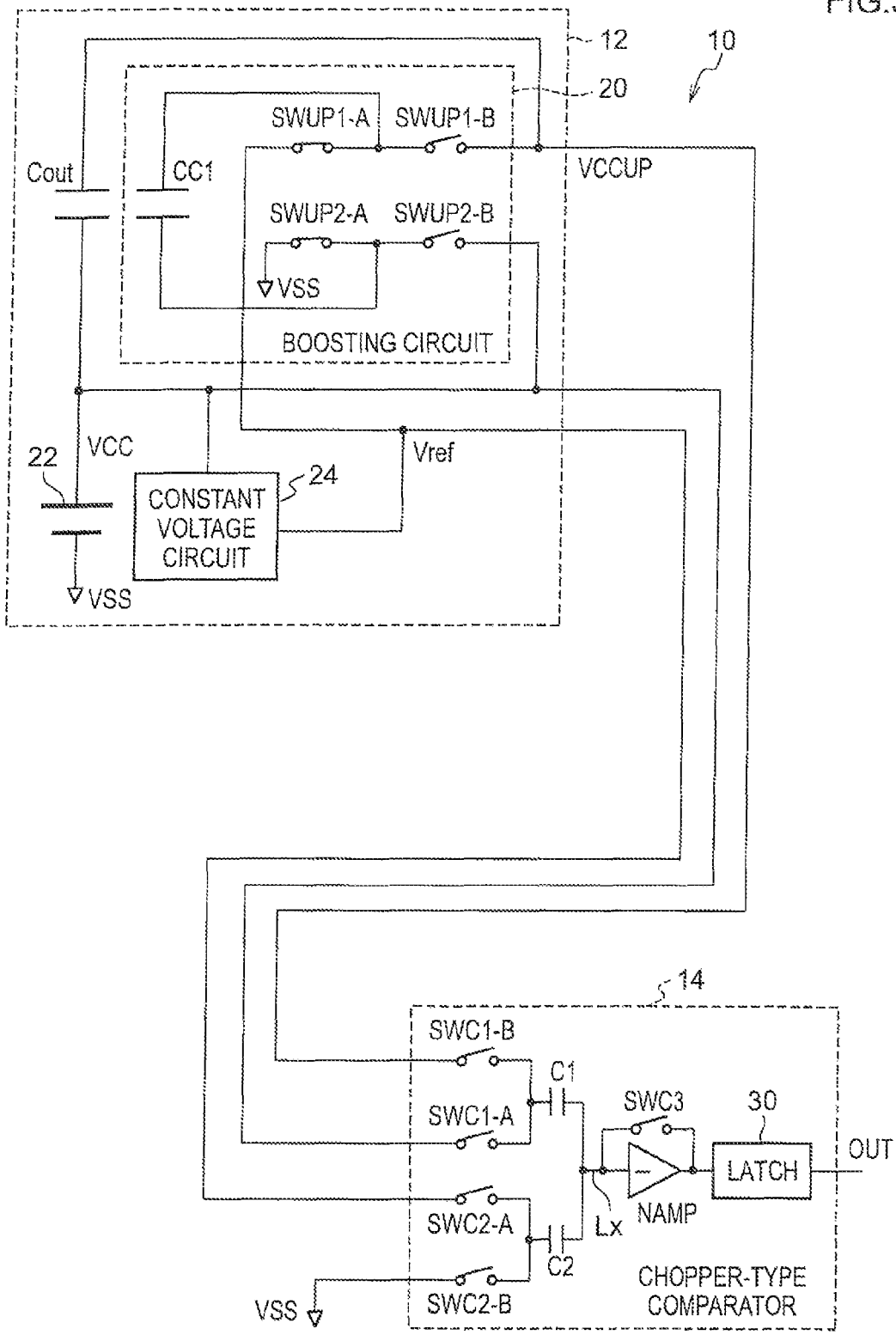
FIG. 3 is a circuit diagram showing the state of the boosting system in a boosting operation according to the first exemplary embodiment.
Figure 4:
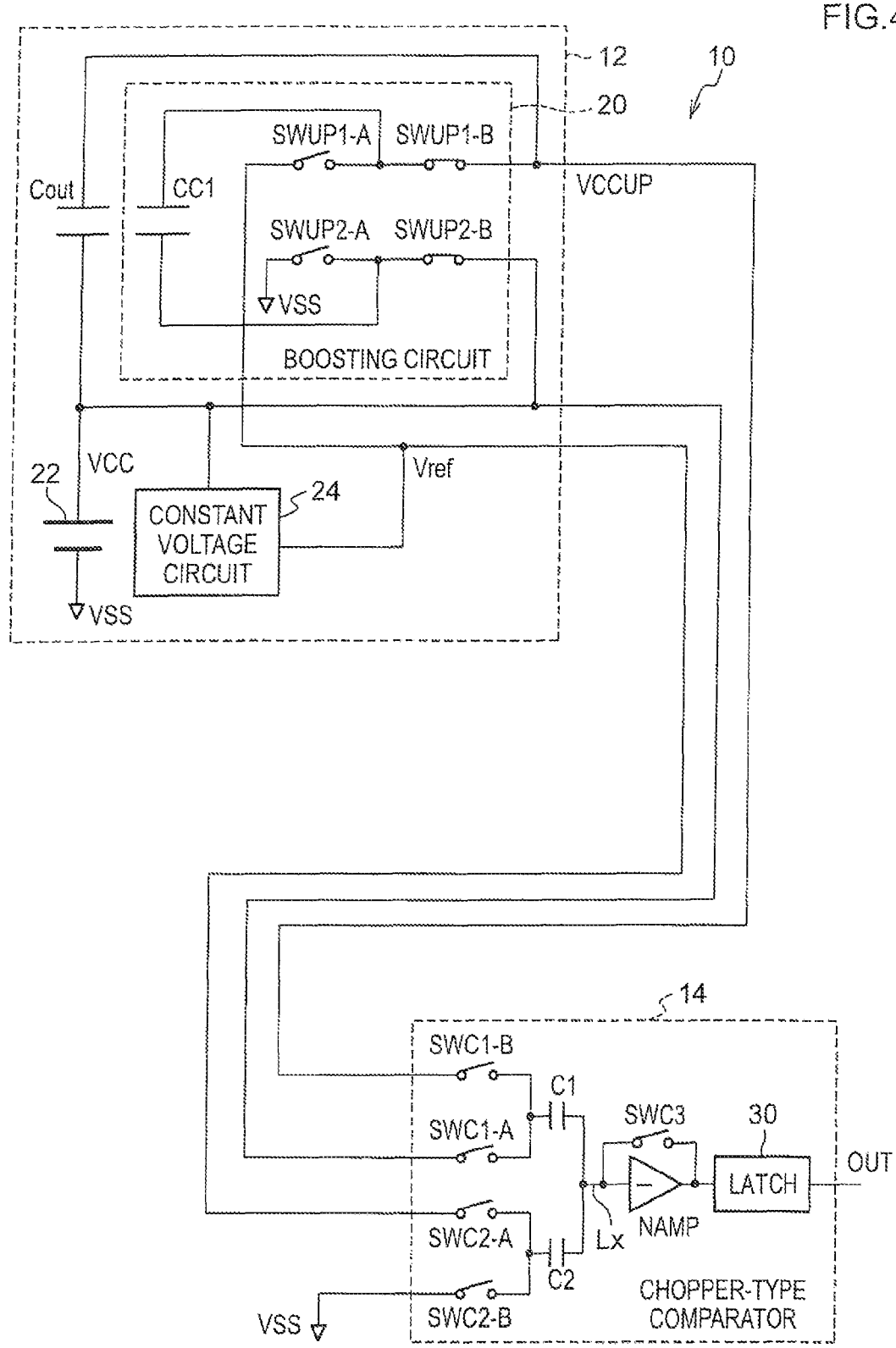
FIG. 4 is a circuit diagram showing the state of the boosting system in the boosting operation according to the first exemplary embodiment.

First, description is given of the boosting operation by the boosting circuit 20 at the boosting section 12 of the present exemplary embodiment. FIG. 3 and FIG. 4 are circuit diagrams showing the state of the boosting system 10 in the boosting operation of the boosting section 12 (the boosting circuit 20) of the present exemplary embodiment.

First, as shown in FIG. 3, the switching elements SWUP1-A, SWUP2-A are turned ON, and the switching elements SWUP1-B, SWUP2-B are turned OFF. Due thereto, the power supply voltage VCC charges the capacitor Cout by the power supply 22, the constant voltage Vref charges the capacitor CC1 by the constant voltage circuit 24.

Next, as shown in FIG. 4, the switching elements SWUP1-A, SWUP2-A are turned OFF, and the switching elements SWUP1-B, SWUP2-B are turned ON. Due thereto, the capacitor Cout and the capacitor CC1 are connected in parallel, and boosted voltage VCCUP, obtained by the constant voltage Vref being added to the power supply voltage VCC, is generated and is outputted from the boosting section 12.

Due to these operations being repeated at the boosting section 12 (the boosting circuit 20) of the present exemplary embodiment, the power supply voltage VCC is boosted by the constant voltage Vref to the boosted voltage VCCUP, and is outputted.

Next, diagnosis of the boosting section 12 (the boosting circuit 20) at the boosting system 10 of the present exemplary embodiment is described.

In the boosting system 10 of the present exemplary embodiment, the comparison circuit 14 is structured as a chopper-type comparator. The comparison circuit 14 includes switching elements SWC1-A, SWC2-A, SWC1-B, SWC2-B, capacitors C1, C2, switching element SWC3, a single inverting amplifier NAMP of its own threshold voltage Vx, and a latch circuit (Latch) 30.

The switching element SWC1-A connects the boosting section 12 to the capacitor C1 such that the power supply voltage VCC is inputted and the switching element SWC2-A connects the boosting section 12 to the capacitor C1 such that the constant voltage Vref is inputted. Further, the switching element SWC1-B connects the boosting section 12 to the capacitor C2 such that the boosted voltage VCCUP is inputted, and the switching element SWC2-B connects GND (in the present exemplary embodiment, GND potential=voltage VSS) to the capacitor C2.

The latch circuit 30 determines and outputs the logic value (H level and L level) from the output voltage of the single inverting amplifier NAMP.

Figure 5:
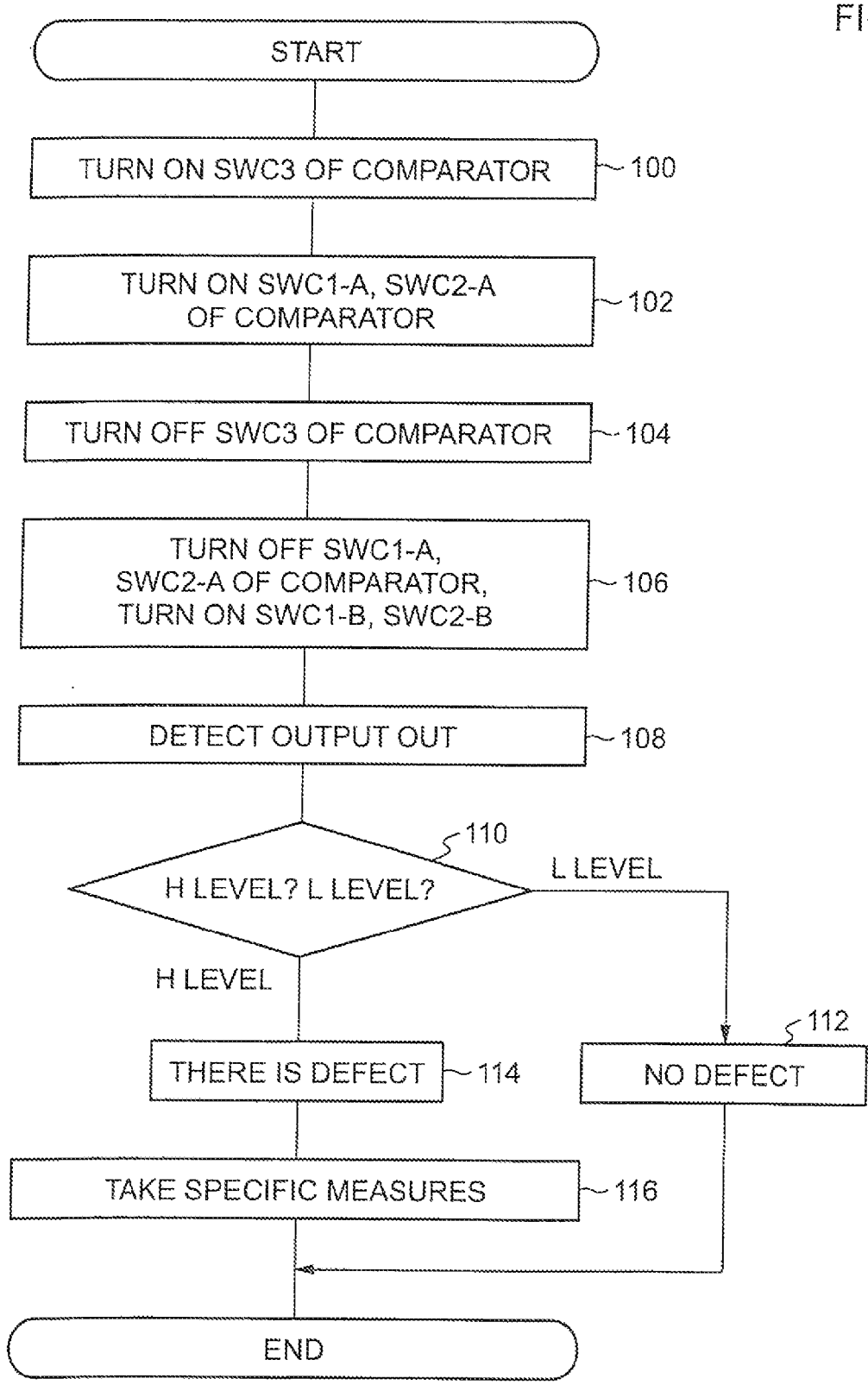
FIG. 5 is a flowchart showing the flow of a boosting circuit diagnosis operation according to the first exemplary embodiment.

The diagnosis operation of the boosting section 12 (the boosting circuit 20) at the boosting system 10 of the present exemplary embodiment is described. The boosting circuit diagnosis operation of the present exemplary embodiment may be divided into an initializing operation and a comparing operation (that includes a diagnosing operation in the present exemplary embodiment). A flowchart of an example of the flow of the overall diagnosis operation of the boosting circuit 20 of the present exemplary embodiment is shown in FIG. 5. Further, a circuit diagram showing the state of the boosting system 10 in the initializing operation is shown in FIG. 6, and a circuit diagram showing the state of the boosting system 10 in the comparing operation is shown in FIG. 7.

In step 100, the switching element SWC3 of the comparison circuit 14 is turned ON. Due thereto, the voltage of an input signal line Lx of the single inverting amplifier NAMP of the comparison circuit 14 becomes the own threshold voltage Vx of the single inverting amplifier NAMP.

Figure 6:
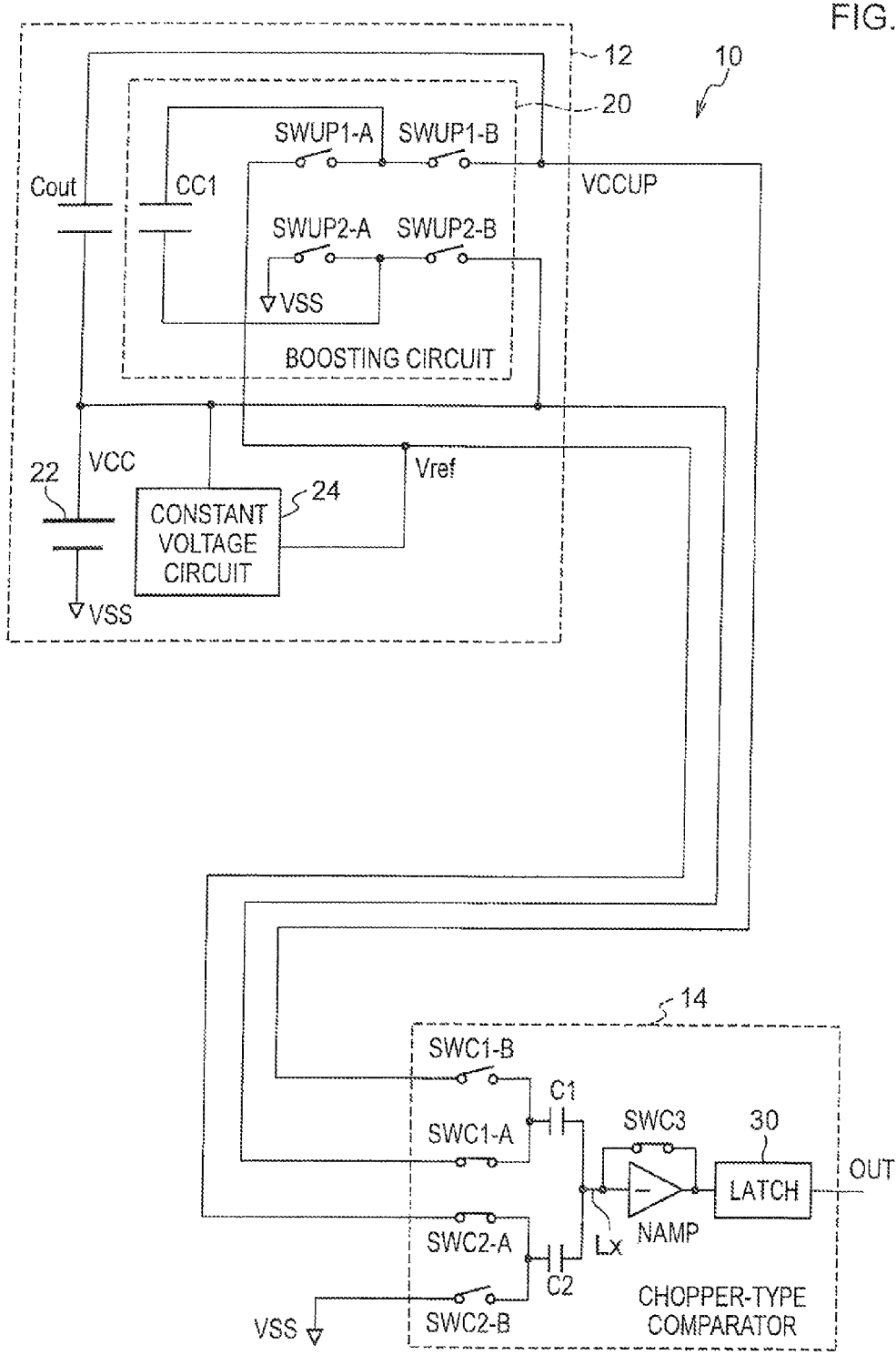
FIG. 6 is a circuit diagram showing the state of the boosting system in an initializing operation of the boosting circuit diagnosis operation according to the first exemplary embodiment.
Figure 7:
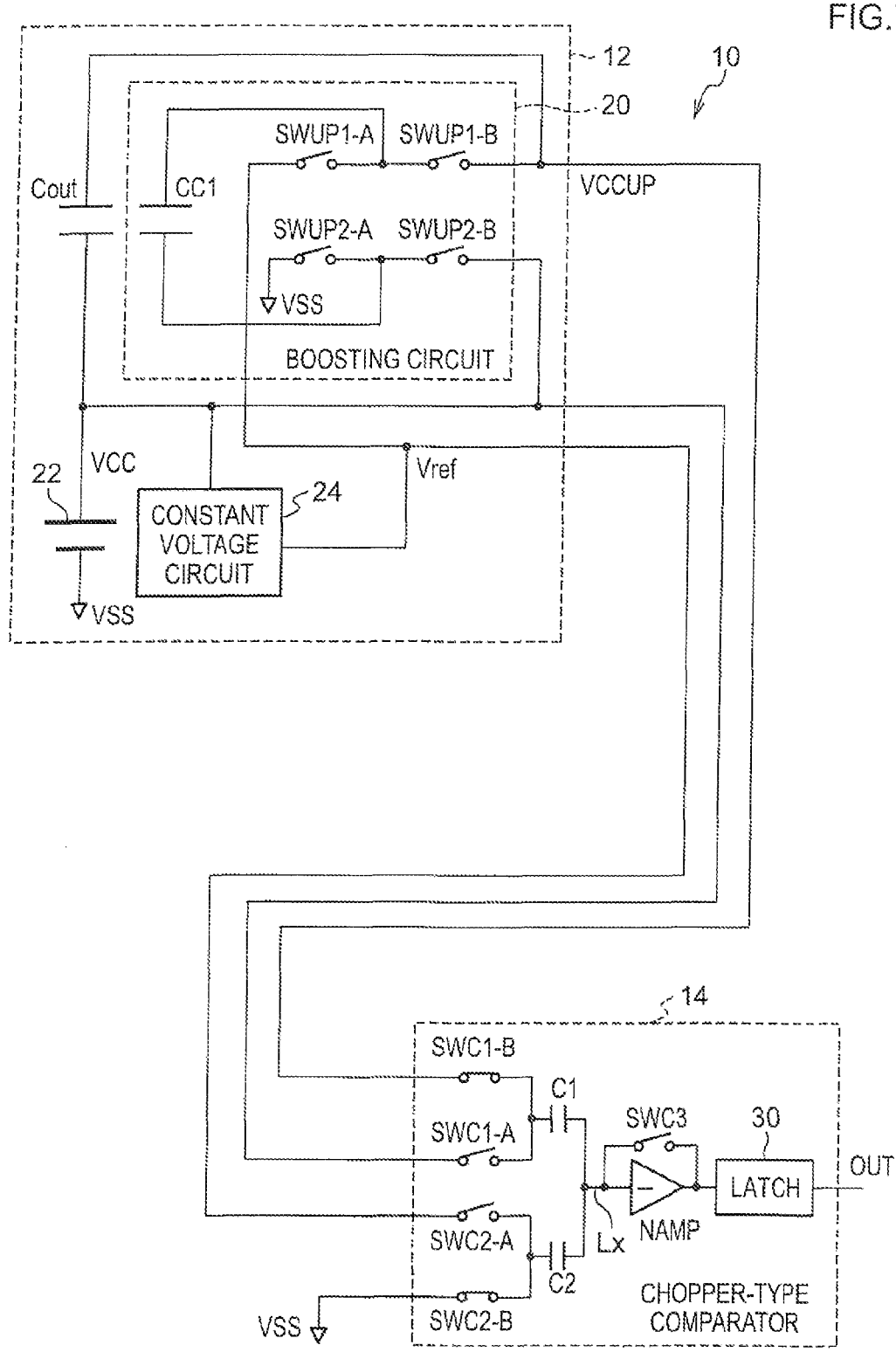
FIG. 7 is a circuit diagram showing the state of the boosting system in a comparing operation of the boosting circuit diagnosis operation according to the first exemplary embodiment.

In next step 102, the switching elements SWC1-A, SWC2-A of the comparison circuit 14 are turned ON (see FIG. 6). Due thereto, the difference between the power supply voltage VCC and the own threshold voltage Vx (power supply voltage VCC−own threshold voltage Vx) charges the capacitor C1. Further, the difference between the constant voltage Vref and the own threshold voltage Vx (constant voltage Vref−own threshold voltage Vx) charges the capacitor C2. When the electrostatic capacities of the capacitors C1, C2 are denoted as electrostatic capacities C1, C2 respectively, charges Q1, Q2 of the capacitors C1, C2 may be expressed by following expression (1) and expression (2).

$$Q1 = C1 \times (VCC - Vx) \qquad (1)$$

$$Q2 = C2 \times (Vref - Vx) \qquad (2)$$

Note that step 100 and step 102 correspond to the initializing operation of the present exemplary embodiment.

When the initializing operation ends, in next step 104, the switching element SWC3 of the comparison circuit 14 is turned OFF (see FIG. 7). Due thereto, the voltage of the input Lx of the single inverting amplifier NAMP becomes a high impedance state, and the charges Q1, Q2 of the capacitors C1, C2, that were charged in the above-described initialization operation, are stored.

In next step 106, the switching elements SWC1-A, SWC2-A of the comparison circuit 14 are turned OFF, and the switching elements SWC1-B, SWC2-B are turned ON (see FIG. 7). At this time, when the voltage of the input signal line Lx is denoted as voltage Vx' and the charges of the capacitors C1, C2 are denoted as charges Q1', Q2', the charges Q1', Q2' may expressed by following expression (3), expression (4).

$$Q1' = C1 \times (VCCUP - Vx') \qquad (3)$$

$$Q2' = C2 \times (VSS - Vx) \qquad (4)$$

Here, at the time of the initializing operation and at the time of the comparing operation, the electrostatic capacities C1, C2 of the capacitors C1, C2 do not vary, and therefore, the relationship expressed by following expression (5) may be established.

$$Q1 + Q2 = Q1' + Q2' \qquad (5)$$

Accordingly, from above expressions (1) through (5), $$Vx' - Vx = C1/(C1+C2) \times ((VCCUP - VCC) - C2/C1 \times (Vref - VSS)) \qquad (6)$$

may be established.

Here, when the output voltage of the single inverting amplifier NAMP is denoted as Vnampout and the gain is denoted as Gnamp, following expression (7) may be established.

$$Vnampout = -Gnamp \times (Vx' - Vx) \qquad (7)$$

When the gain Gnamp is sufficiently high, the output logic of the single inverting amplifier NAMP is determined by the positive/negative sign of voltage Vx'−own threshold voltage Vx. The positive/negative sign of voltage Vx'−own threshold voltage Vx is determined, from above expression (6), by (VCCUP−VCC)−C2/C1×(Vref−VSS).

Here, if the boosting circuit 20 is functioning normally, boosted voltage VCCUP=power supply voltage VCC+constant voltage Vref, and therefore, VCCUP−VCC=Vref−VSS. Accordingly, if the capacitance ratio of the capacitors C1, C2 is set in advance such that there is the relationship electrostatic capacitance C1>electrostatic capacitance C2, following expression (8) may be established.

$$Vx'-Vx=C1/(C1+C2)\times((VCCUP-VCC)-C2/C1\times(Vref-VSS))>0 \qquad (8)$$

Due thereto, the output OUT of the comparison circuit 14 becomes L level.

On the other hand, in this case, if the boosting circuit 20 is not functioning normally, becomes VCCUP−VCC<Vref−VSS, and $$Vx'-Vx=C1/(C1+C2)\times((VCCUP-VCC)-C2/C1\times(Vref-VSS))<0 \qquad (9)$$

and therefore, the output OUT of the comparison circuit 14 becomes H level.

In next step 108, the output OUT that is outputted from the comparison circuit 14 is detected. In subsequent step 110, it is determined whether the output OUT is H level or L level. If the output OUT is L level, the process proceeds to step 112, and as described above, it the diagnosed that there is no defect with the boosting circuit 20 (i.e., that the boosting circuit 20 is operating normally), and thereafter, the present operation ends. On the other hand, if the output OUT is H level, the process proceeds to step 114, and as described above, it is diagnosed that there is defect with the boosting circuit 20 (i.e., that the boosting circuit 20 is not operating normally). If there is defect, the process proceeds to step 116 where specific measures are taken, such as operation of the boosting circuit 20 is stopped or the like. Thereafter, the present process ends.

The results of the output OUT in the present exemplary embodiment are as in Table 1.

TABLE 1

| | comparing operation |
|---|---|
| no defect | L level |
| there is defect | H level |

As described above, in the boosting system 10 of the present exemplary embodiment, due to the initializing operation, the difference between the power supply voltage VCC and the own threshold voltage Vx (power supply voltage VCC−own threshold voltage Vx) charges the capacitor C1 of the comparison circuit 14, and the difference between voltage of the constant voltage Vref and the own threshold voltage Vx (constant voltage Vref−own threshold voltage Vx) charges the capacitor C2. In the comparing operation, the boosting section 12 and the capacitor C1 are connected such that the boosted voltage VCCUP is inputted, and GND and the capacitor C2 are connected such that the GND voltage VSS is inputted. If the output OUT is L level, it is diagnosed that there is no defect with the boosting circuit 20, whereas if the output OUT is H level, it is diagnosed that there is defect.

In this way, in the present exemplary embodiment, the difference value between the boosted voltage VCCUP and the power supply voltage VCC, and the difference value between the constant voltage Vref and the GND voltage VSS, are compared by the comparison circuit 14. Due thereto, in the present exemplary embodiment, whether the boosted voltage VCCUP that is generated at the boosting circuit 20 is an appropriate value (whether or not it has been boosted) may be diagnosed. Accordingly, in the present exemplary embodiment, diagnosis may be carried out by utilizing hardware structures (circuits), and not using the CPU as conventional the case. Accordingly, the CPU may not be occupied by diagnosing the boosting circuit 20 and may be used for other processings.

Further, the current consumed by the output of the boosting circuit 20 during diagnosis of the boosting circuit 20 is the current charged to the capacitors C1, C2 of the comparison circuit 14 at the time of the initializing operation. Accordingly, the current that is consumed by the output of the boosting circuit 20 can be made to be as small, to the extent that the matching of the capacitors C1, C2 does not affect the comparing operation. Therefore, in the present exemplary embodiment, consumption of output current of the boosting circuit 20 for diagnosis may be suppressed.

Second Exemplary Embodiment

A boosting system of a second exemplary embodiment of the present invention is described in detail hereinafter with reference to the drawings.

Figure 8:
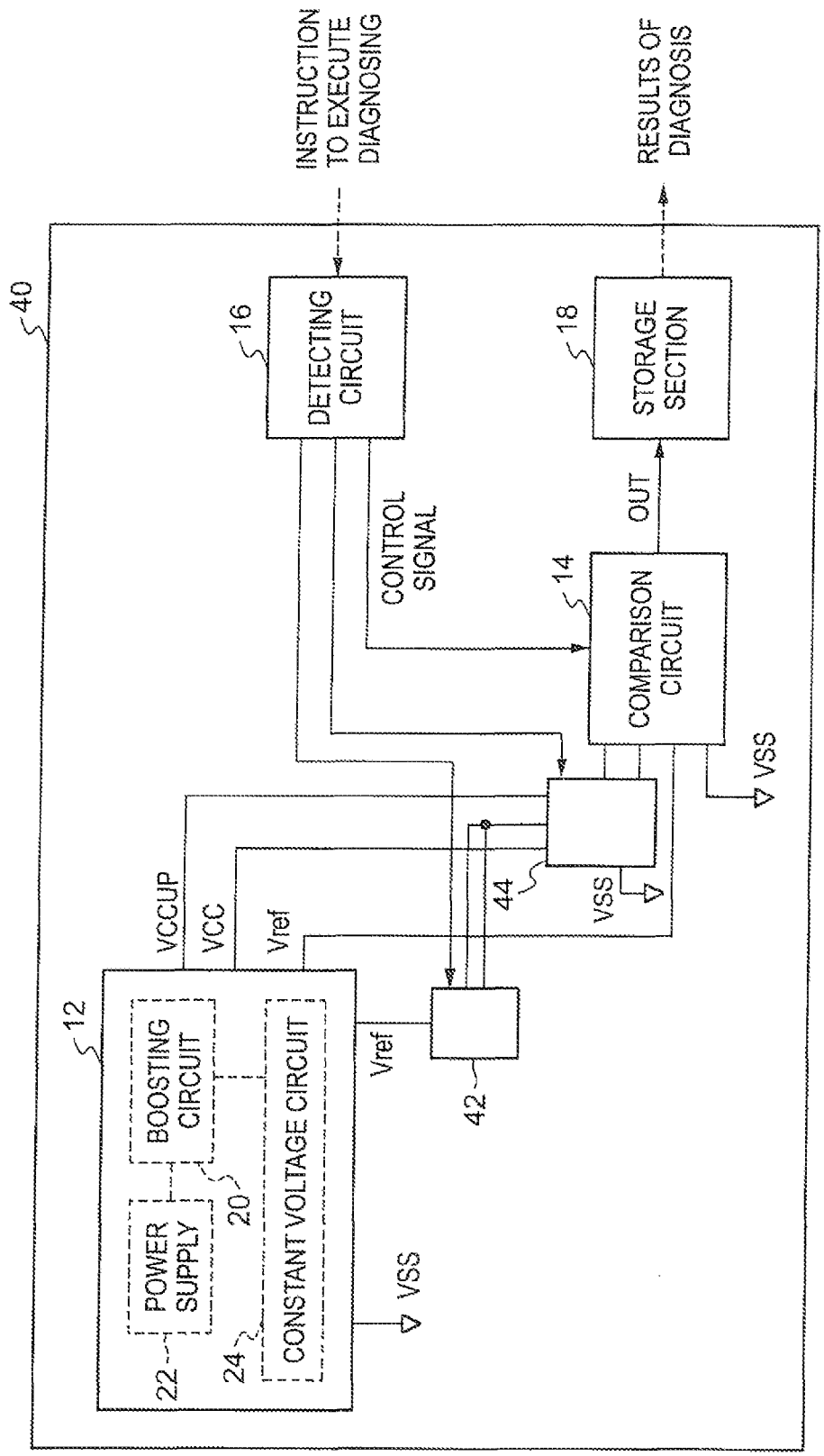
FIG. 8 is a schematic structural drawing showing the schematic structure of a boosting system according to a second exemplary embodiment.

A schematic structural drawing of an example of the schematic structure of a boosting system 40 of the present exemplary embodiment is shown in FIG. 8. Note that, in the present exemplary embodiment, structures and operations that are substantially similar to those of the first exemplary embodiment will be noted as such, and detailed description thereof will be omitted.

In addition to diagnosis of the boosting section 12 (the boosting circuit 20) as in the first exemplary embodiment, the boosting system 40 of the present exemplary embodiment carries out diagnosing of the comparing function of the comparison circuit 14. Therefore, in order to carry out diagnosing of the comparing function of the comparison circuit 14, the boosting system 40 of the present exemplary embodiment includes a comparator reference voltage switch 42 and an input switching switch 44. Because the structures and operations of the boosting section 12, the comparison circuit 14, the detecting circuit 16 and the storage section 18 are substantially similar to those of the first exemplary embodiment, detailed description thereof is omitted.

Figure 9:
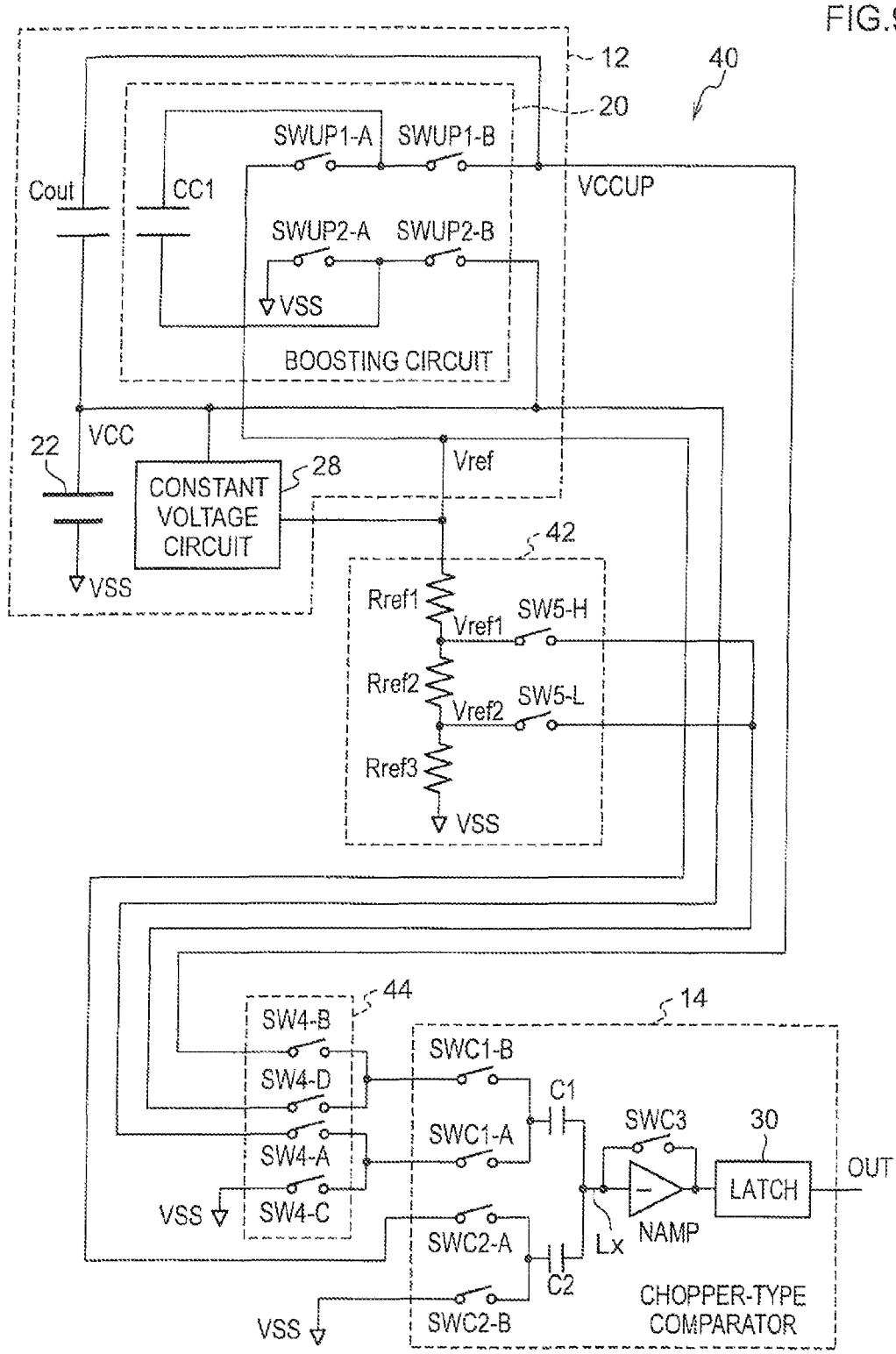
FIG. 9 is a circuit diagram showing the schematic structure of the boosting system according to the second exemplary embodiment.

A circuit diagram of an example of the schematic structure of the boosting system 40 of the present exemplary embodiment is shown in FIG. 9. Note that illustration of the detecting circuit 16 and the storage section 18 is omitted from FIG. 9.

As shown in FIG. 9, the boosting system 40 of the present exemplary embodiment has the comparator reference voltage switch 42 and the input switching switch 44 that are used in diagnosing the comparing function of the comparison circuit 14. The input switching switch 44 switches the input to the capacitor C1 of the comparison circuit 14. The input switching switch 44 includes switching elements SW4-A, SW4-B, SW4-C, SW4-D for switching the input source.

Further, the comparator reference voltage switch 42 switches the reference voltage, that is used in the diagnosis of the comparison circuit 14, between reference voltage Vref1 and reference voltage Vref2 (reference voltage Vref1>reference voltage Vref2). The comparator reference voltage switch 42 includes resistance elements Rref1, Rref2, Rref3, that are connected in series to one another, and are for resistance-dividing the constant voltage Vref, that is generated at the constant voltage circuit 28 of the boosting section 12, and generating the reference voltages Vref1, Vref2, and switching elements SW5-H, SW5-L for switching the reference voltage. One end of the resistance element Rref1 is connected to the constant voltage circuit 24. One end of the resistance element Rref3 is grounded to GND potential (=voltage VSS). Further, due to the switching element SW5-H being turned ON and the switching element SW5-L being turned OFF, the generated reference voltage Vref1 is outputted from the comparator reference voltage switch 42. Due to the switching element SW5-L being turned ON and the switching element SW5-H being turned OFF, the generated reference voltage Vref2 is outputted from the comparator reference voltage switch 42.

Figure 10:
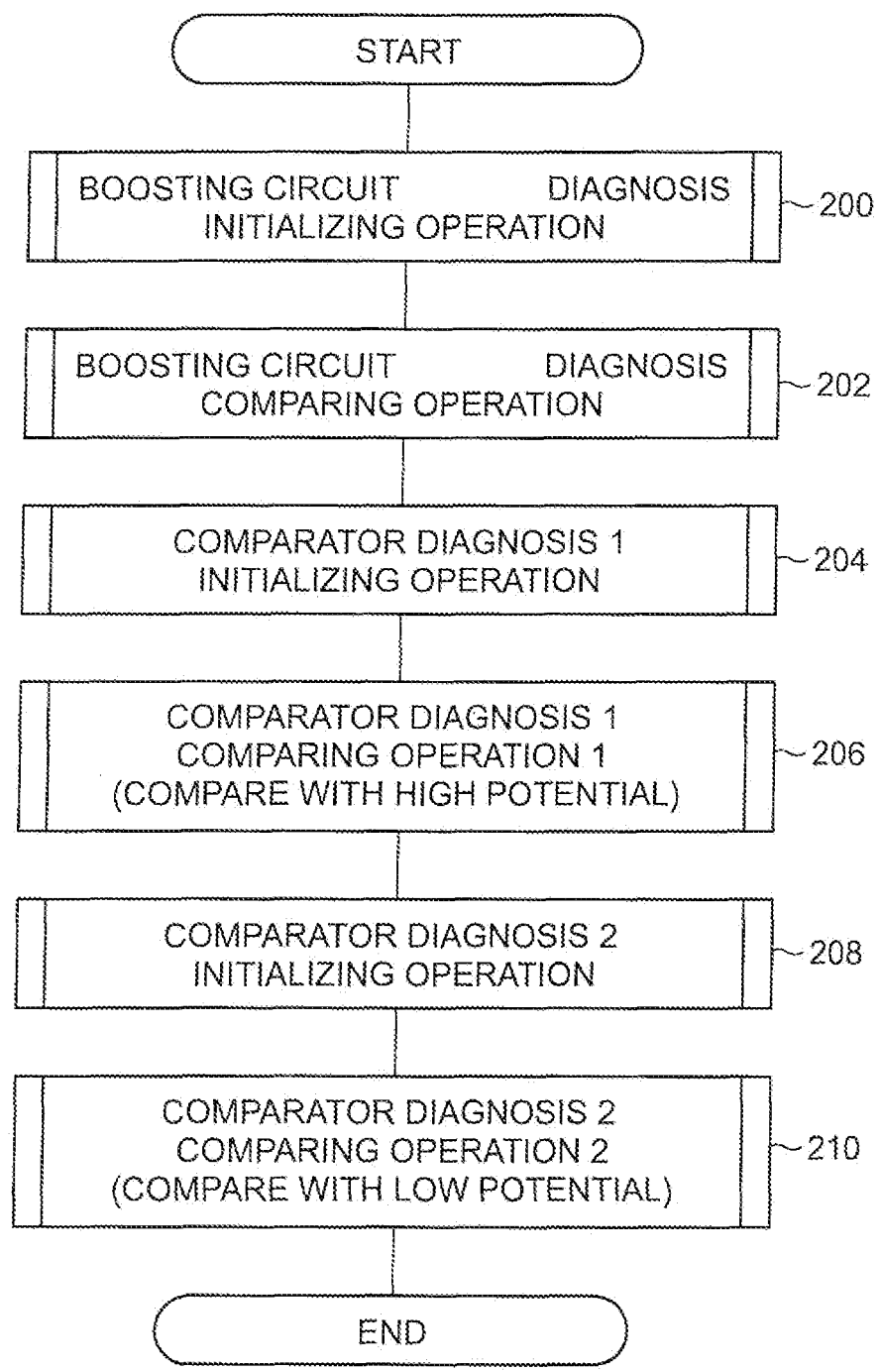
FIG. 10 is a flowchart showing the flow of a boosting circuit diagnosis operation and an overall comparator diagnosing operation according to the second exemplary embodiment.

The diagnosis operation of the boosting section 12 (the boosting circuit 20) and the diagnosing operation of the comparing function of the comparison circuit 14, at the boosting system 10 of the present exemplary embodiment, is described. Note that, in the present exemplary embodiment, as an example, a case is described in which the operation of diagnosing the comparing function of the comparison circuit 14 is carried out in succession with the diagnosis operation of the boosting section 12 (the boosting circuit 20). A flowchart of an example of the flow of this entire operation in the present exemplary embodiment is shown in FIG. 10. Note that the overall flow is shown here, and details of the respective operations are described after.

In step 200, the initializing operation in the diagnosis operation of the boosting circuit 20 is carried out. In next step 202, the comparing operation in the diagnosis operation of the boosting circuit 20 is carried out. Defect of the boosting circuit 20 is thereby diagnosed.

In next step 204, an initializing operation in the diagnosing operation (comparator diagnosis 1) of the comparing function of the comparison circuit 14 is carried out. In next step 206, a comparing operation (comparing operation 1) in the diagnosing operation (comparator diagnosis 1) of the comparing function of the comparison circuit 14 is carried out. In the subsequent step 208, an initializing operation in the diagnosing operation (comparator diagnosis 2) of the comparing function of the comparison circuit 14 is carried out. In next step 210, a comparing operation (comparing operation 2) in the diagnosing operation (comparator diagnosis 2) of the comparing function of the comparison circuit 14 is carried out. Thereafter, the present process ends. The comparison circuit 14 is thereby diagnosed.

The above-described (FIG. 10) respective operations are described in detail next.

Figure 11:
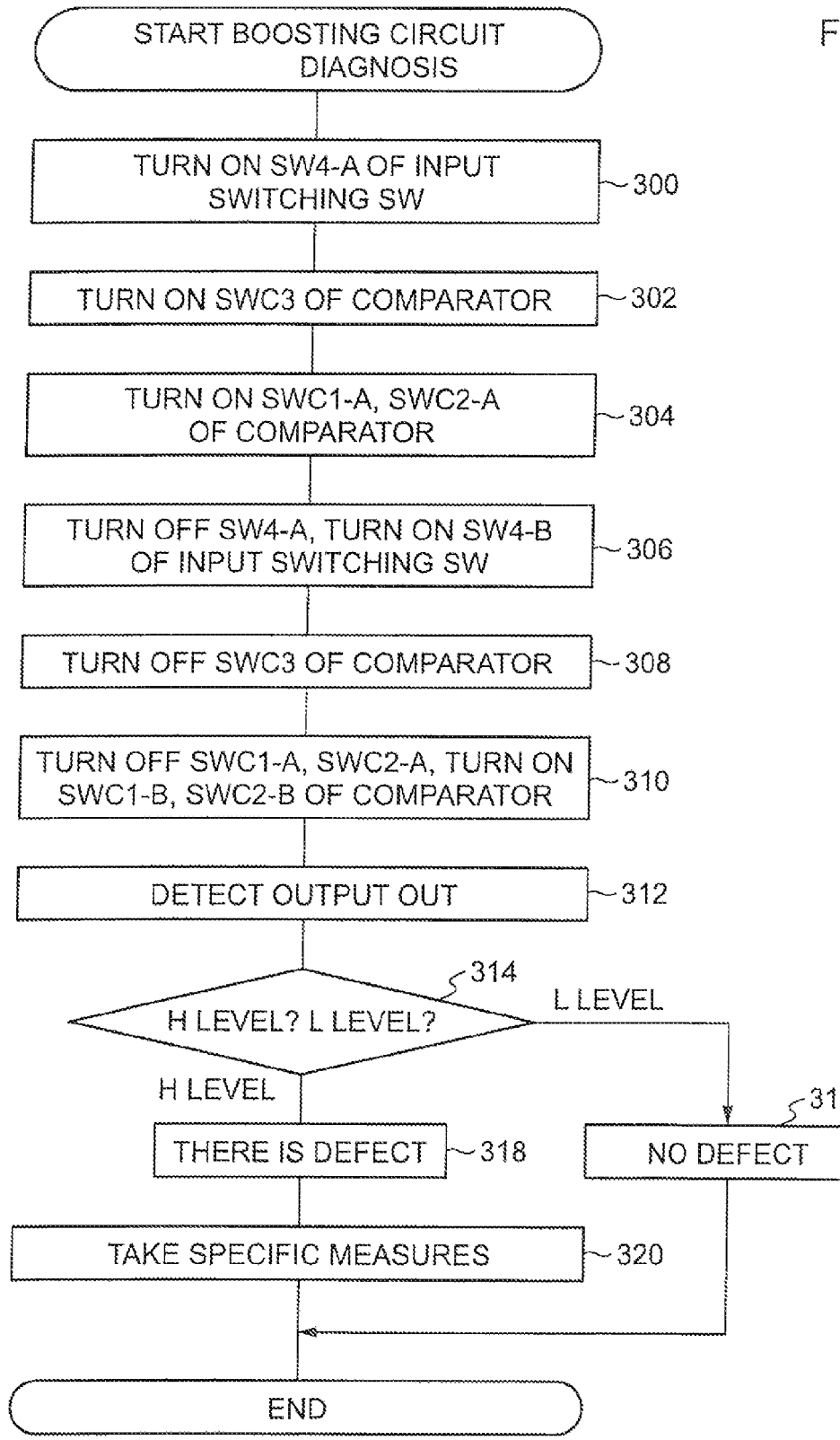
FIG. 11 is a flowchart showing the flow of the boosting circuit diagnosis operation according to the second exemplary embodiment.

First, the diagnosis operation (steps 200, 202 of FIG. 10) of the boosting section 12 (the boosting circuit 20) at the boosting system 40 of the present exemplary embodiment is described. The diagnosis operation of the boosting circuit of the present exemplary embodiment is an operation that is substantially similar to that of the first exemplary embodiment, and can be divided into an initializing operation and a comparing operation (that includes a diagnosing operation in the present exemplary embodiment). A flowchart of an example of the flow of the overall boosting circuit diagnosis operation of the present exemplary embodiment is shown in FIG. 11. Further, a circuit diagram showing the state of the boosting system 40 in the initializing operation is shown in FIG. 12, and a circuit diagram showing the state of the boosting system 40 in the comparing operation is shown in FIG. 13.

Figure 12:
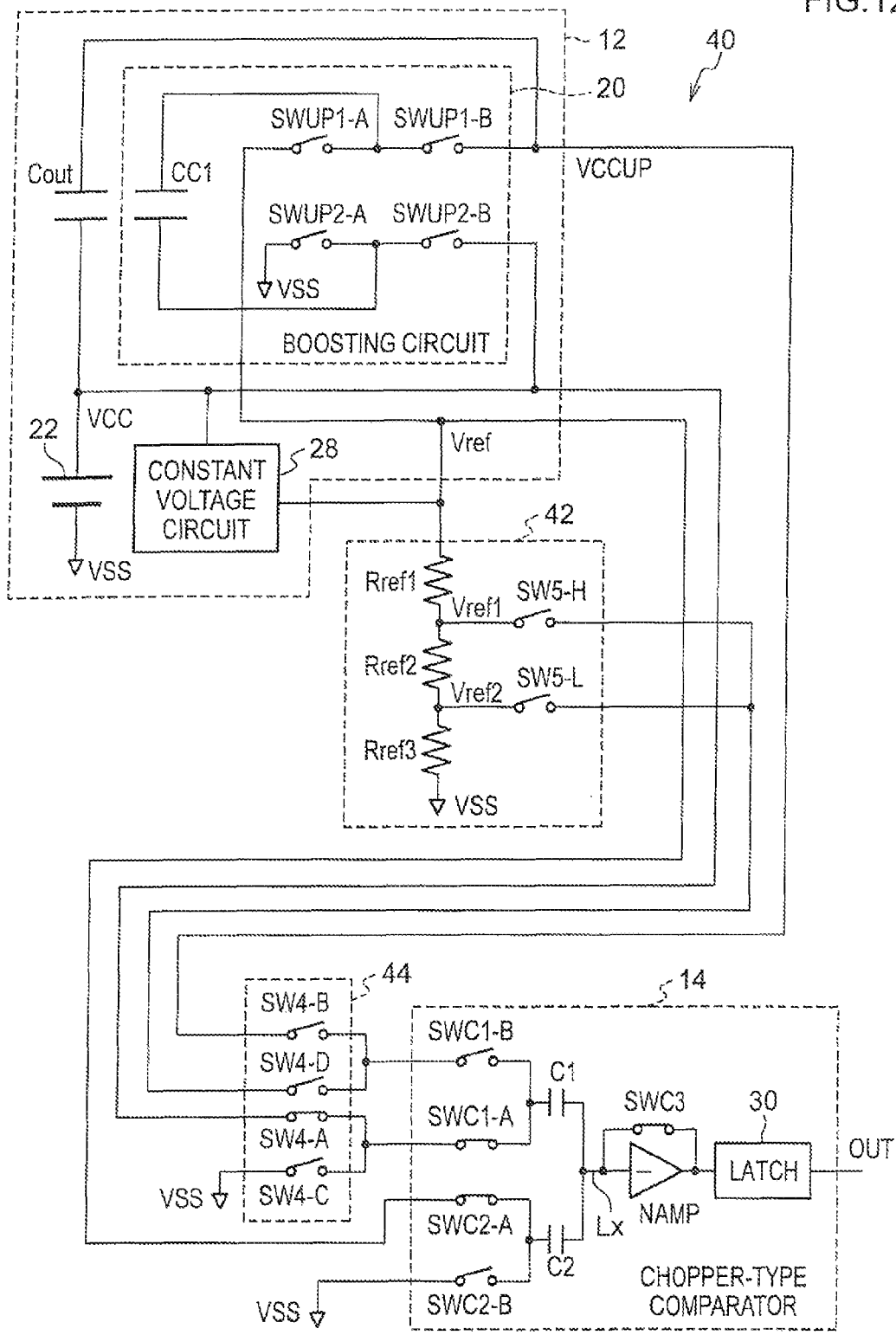
FIG. 12 is a circuit diagram showing the state of the boosting system in an initializing operation of the boosting circuit diagnosis operation according to the second exemplary embodiment.

In step 300, the switching element SW4-A of the input switching switch 44 is turned ON (see FIG. 12). Due thereto, the power supply voltage VCC is inputted to the capacitor C1 of the comparison circuit 14.

Next step 302, that corresponds to the initializing operation, corresponds to step 100 of the first exemplary embodiment (see FIG. 5), and step 304 corresponds to step 102. Due to these steps, the difference between the power supply voltage VCC and the own threshold voltage Vx (power supply voltage VCC−own threshold voltage Vx) charges the capacitor C1. Further, the difference between the constant voltage Vref and the own threshold voltage Vx (constant voltage Vref−own threshold voltage Vx) charges the capacitor C2.

Figure 13:
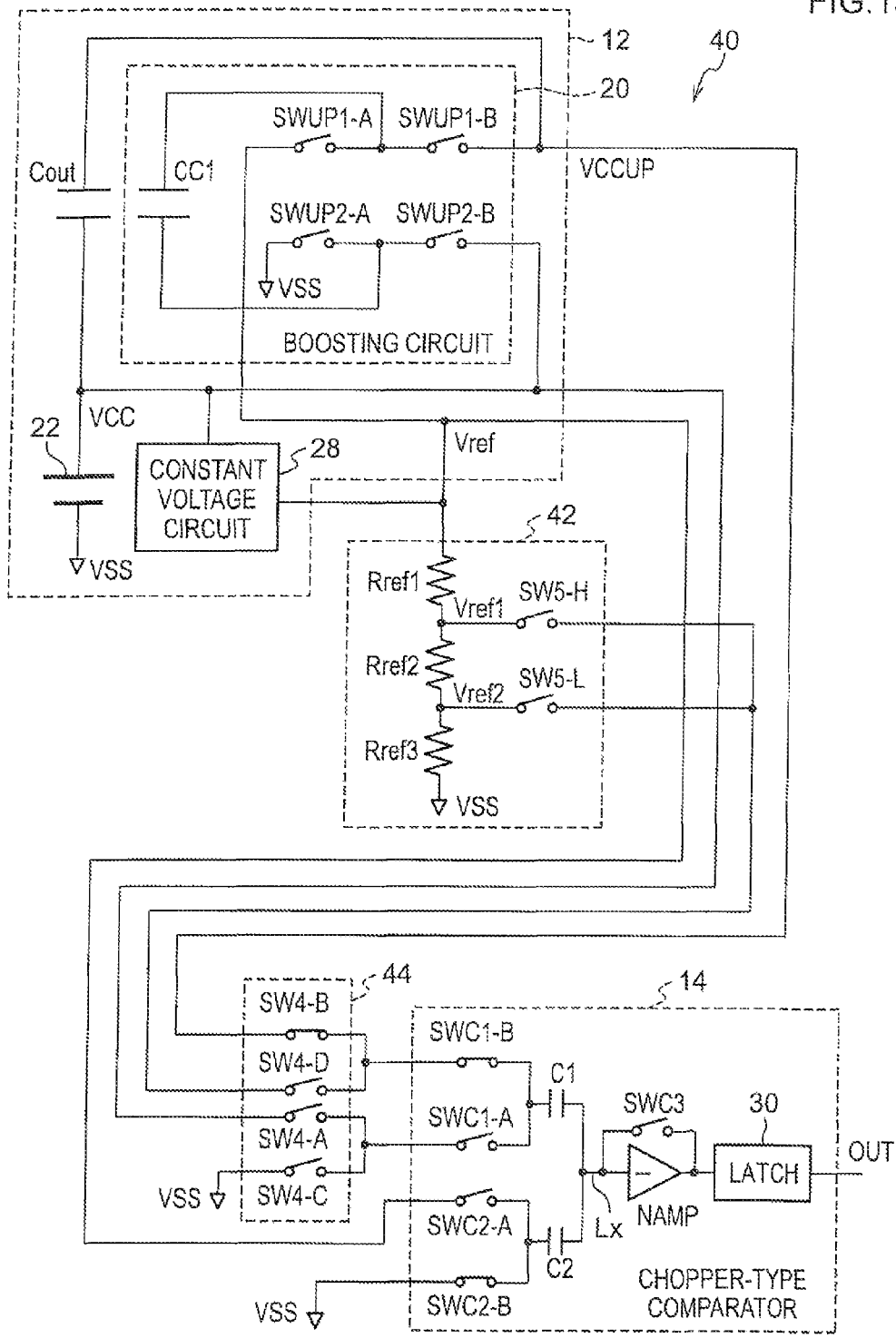
FIG. 13 is a circuit diagram showing the state of the boosting system in a comparing operation of the boosting circuit diagnosis operation according to the second exemplary embodiment.

When the initializing operation ends, in next step 306, the switching element SW4-A of the input switching switch 44 is turned OFF, and the switching element SW4-B is turned on (see FIG. 13). Due thereto, the boosted voltage VCCUP is inputted to the capacitor C1 of the comparison circuit 14.

Next step 308 corresponds to step 104 of the first exemplary embodiment (see FIG. 5), and step 310 corresponds to step 106. Due to these steps, following expression (10) may be established in the same way as in the first exemplary embodiment, when the voltage of the input signal line Lx at this time is denoted as voltage Vx'.

$$Vx'-Vx=C1/(C1+C2)\times((VCCUP-VCC)-C2/C1\times(Vref-VSS)) \quad (10)$$

Here, when the output voltage of the single inverting amplifier NAMP is denoted as Vnampout and the gain is denoted as Gnamp, following expression (11) may be established.

$$Vnampout=-Gnamp\times(Vx'-Vx) \quad (11)$$

When the gain Gnamp is sufficiently high, the output logic of the single inverting amplifier NAMP is determined by the positive/negative sign of voltage Vx'−own threshold voltage Vx. The positive/negative sign of voltage Vx'−own threshold voltage Vx is determined, from above expression (10), by (VCCUP−VCC)−C2/C1×(Vref−VSS).

Here, if the boosting circuit 20 is functioning normally, boosted voltage VCCUP becomes, power supply voltage VCC+constant voltage Vref. Therefore, VCCUP−VCC=Vref−VSS. Accordingly, if the capacitance ratio of the capacitors C1, C2 is set in advance such that there is the relationship electrostatic capacitance C1>electrostatic capacitance C2, following expression (12) may be established.

$$Vx'-Vx=C1/(C1+C2)\times((VCCUP-VCC)-C2/C1\times(Vref-VSS))>0 \quad (12)$$

Due thereto, the output OUT of the comparison circuit 14 becomes L level. On the other hand, in this case, if the boosting circuit 20 is not functioning normally, the output OUT of the comparison circuit 14 becomes H level.

Next step 312 corresponds to step 108 (see FIG. 5) and step 314 corresponds to step 110 of the first exemplary embodiment. When the output OUT of the comparison circuit 14 is L level, the process proceeds to step 316 where it is diagnosed that there is no defect with the boosting circuit 20 (i.e., that the boosting circuit 20 is operating normally) as described above, and thereafter, the present operation ends. On the other hand, if the output OUT is H level, the process proceeds to step 318 where it is diagnosed that there is defect with the boosting circuit 20 as described above. In next step 320, specific measures are taken, such as operation of the boosting circuit 20 is stopped or the like, and thereafter, the process of diagnosis of the boosting circuit 20 ends.

Figure 14:
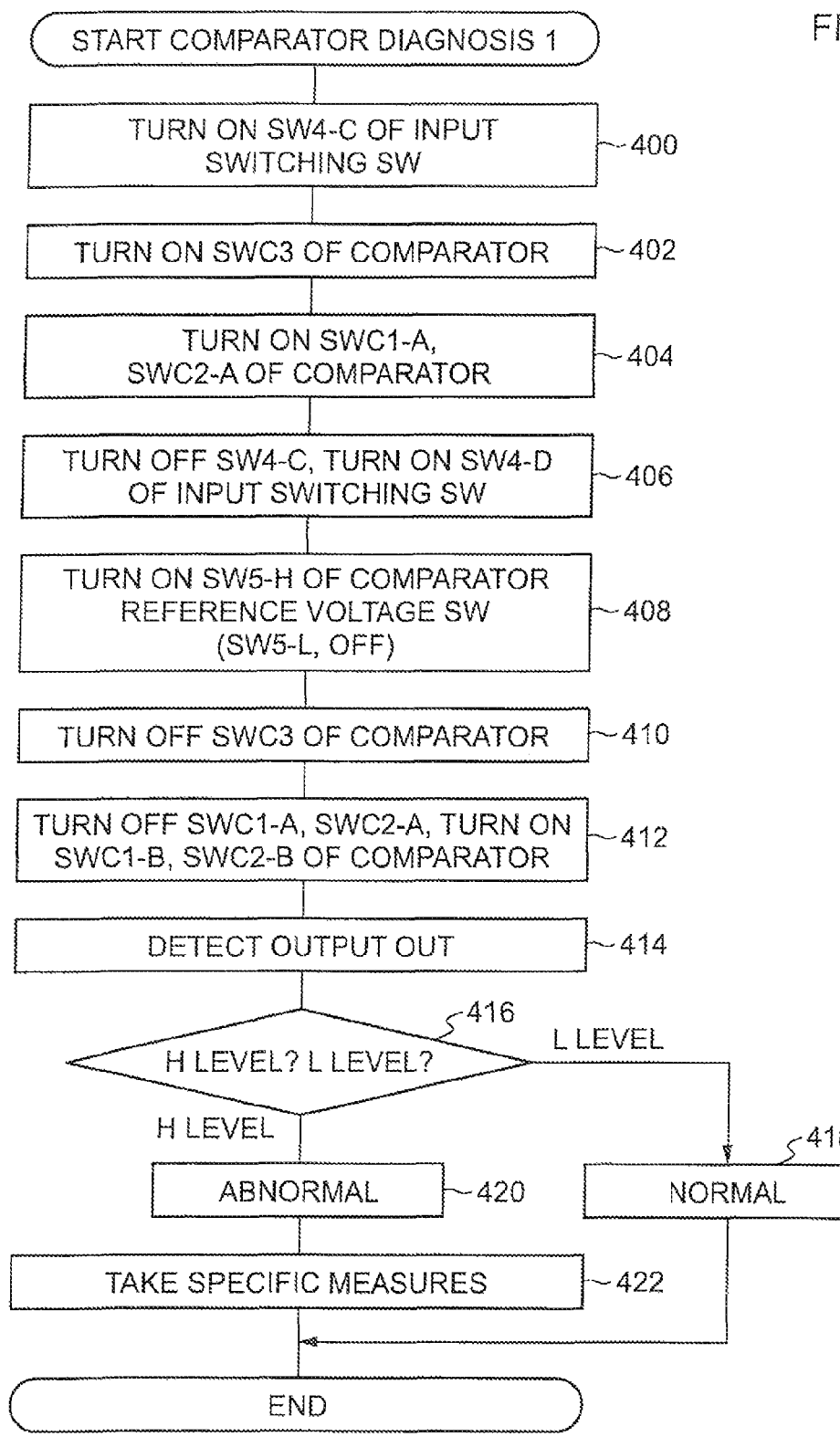
FIG. 14 is a flowchart showing the flow of comparator diagnosing operation 1 according to the second exemplary embodiment.

Of the operations of diagnosing the comparing function of the comparison circuit 14 at the boosting system 40 of the present exemplary embodiment, comparator diagnosis 1 (steps 204, 206 of FIG. 10) is described next. Comparator diagnosis 1, that is an operation that diagnoses the comparing function of the comparison circuit 14 of the present exemplary embodiment, is an operation that is similar to the diagnosis operation of the boosting circuit 20, and can be divided into an initializing operation and comparing operation 1 (that includes a diagnosing operation in the present exemplary embodiment). A flowchart that is an example of the flow of the overall operation of comparator diagnosis 1, that is a diagnosing operation of the comparing function of the comparison circuit 14 of the present exemplary embodiment, is shown in FIG. 14. Further, a circuit diagram showing the state of the boosting system 40 in the initializing operation is shown in FIG. 15, and a circuit diagram showing the state of the boosting system 40 in comparing operation 1 is shown in FIG. 16.

Figure 15:
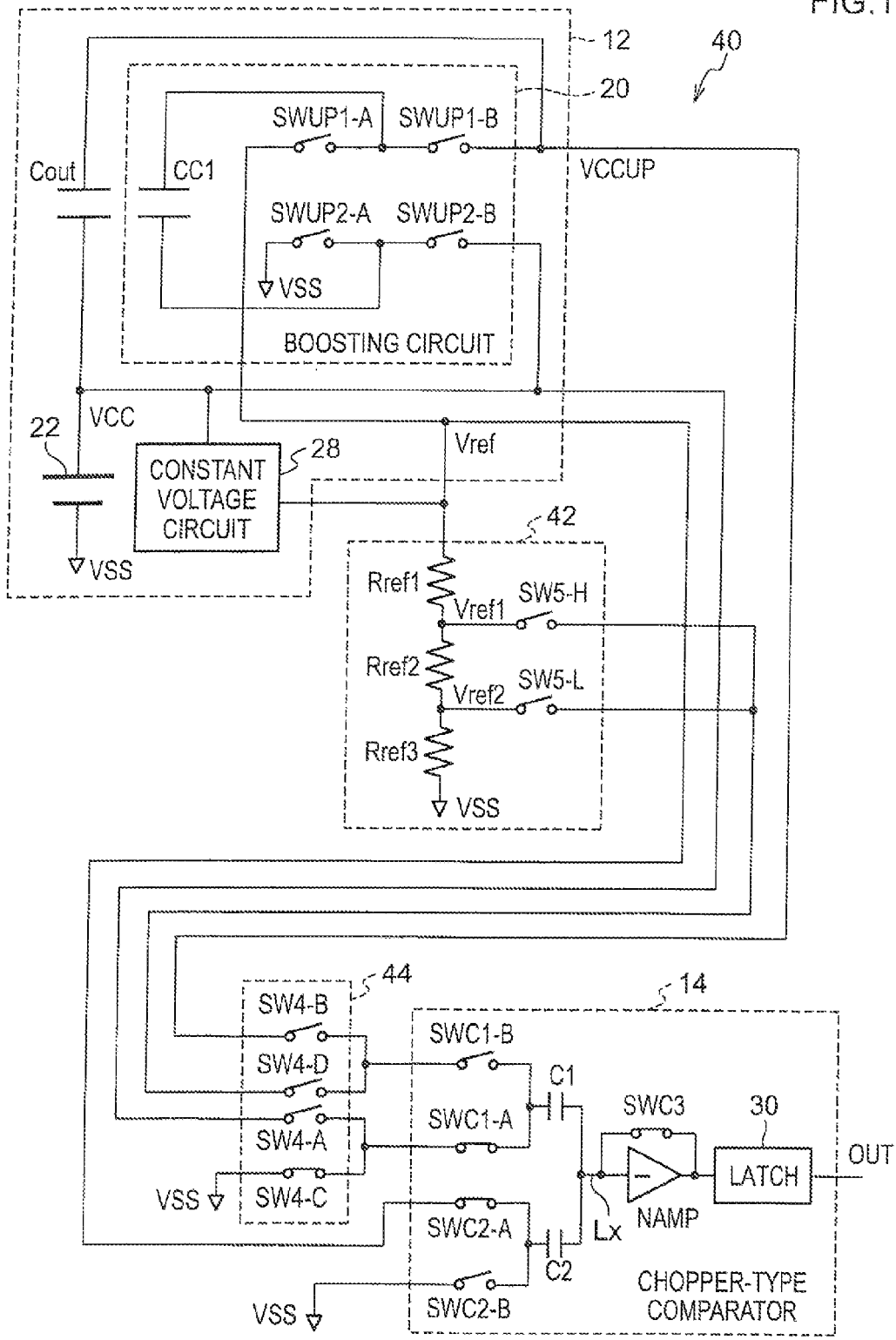
FIG. 15 is a circuit diagram showing the state of the boosting system in initializing of the comparator diagnosing operation 1 according to the second exemplary embodiment.

In step 400, the switching element SW4-C of the input switching switch 44 is turned ON (see FIG. 15). Due thereto, the GND voltage VSS is inputted to the capacitor C1 of the comparison circuit 14.

Next step 402, that corresponds to the initializing operation, corresponds to step 302 of the diagnosis operation of the boosting circuit 20 (see FIG. 11), and step 404 corresponds to step 304. Due to these steps, the difference between the GND voltage VSS and the own threshold voltage Vx (GND voltage VSS−own threshold voltage Vx) charges the capacitor C1. Further, the difference between the constant voltage Vref and the own threshold voltage Vx (constant voltage Vref−own threshold voltage Vx) charges the capacitor C2.

Figure 16:
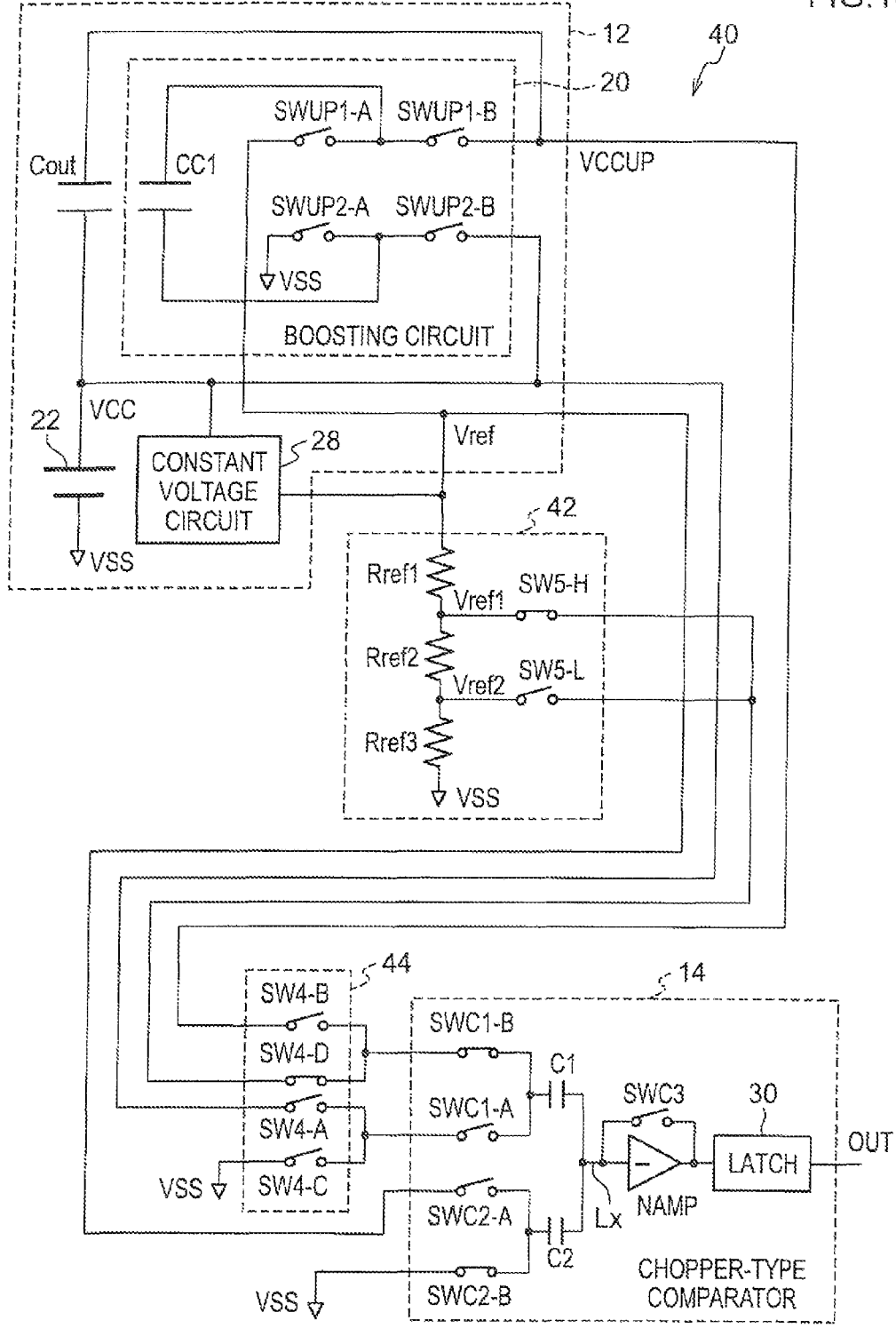
FIG. 16 is a circuit diagram showing the state of the boosting system in comparing operation 1 of the comparator diagnosing operation 1 according to the second exemplary embodiment.

When the initializing operation ends, in next step 406, the switching element SW4-C of the input switching switch 44 is turned OFF, and the switching element SW4-D is turned ON (see FIG. 16). Due thereto, the capacitor C1 of the comparison circuit 14 and the comparator reference voltage switch 42 are connected.

In next step 408, the switching element SW5-H of the comparator reference voltage switch 42 is turned ON. Note that, if the switching element SW5-L is ON at this time, the switching element SW5-L is turned Off. The reference voltage Vref1, that is generated by the constant voltage Vref being resistance-divided at the comparator reference voltage switch 42, is thereby outputted to the comparison circuit 14. Note that the reference voltage Vref1 is expressed by following expression (13), where the resistance values of the resistance elements Rref1, Rref2, Rref3 are resistances Rref1, Rref2, Rref3, respectively.

$$Vref1 = (Rref2 + Rref3)/(Rref1 + Rref2 + Rref3) \times Vref \quad (13)$$

Next step 410 corresponds to step 308 of the diagnosis operation of the boosting circuit 20 (see FIG. 11), and step 412 corresponds to step 310. Due to these steps, following expression (14) may be established in the same way as in the first exemplary embodiment, when the voltage of the input signal line Lx at this time is denoted voltage Vx'.

$$Vx' - Vx = C1/(C1+C2) \times ((Vref1 - VSS) - C2/C1 \times (Vref - VSS)) \quad (14)$$

Here, when the output voltage of the single inverting amplifier NAMP is denotes as Vnampout and the gain is denoted as Gnamp, following expression (15) may be established.

$$Vnampout = -Gnamp \times (Vx' - Vx) \quad (15)$$

When the gain Gnamp is sufficiently high, the output logic of the single inverting amplifier NAMP is determined by the positive/negative sign of voltage Vx'−own threshold voltage Vx. The positive/negative sign of voltage Vx'−own threshold voltage Vx is determined, from above expression (14), by (Vref1−VSS)−C2/C1×(Vref−VSS).

Here, if the resistance ratio (resistance values) of the resistance elements Rref1, Rref2, Rref3 of the comparator reference voltage switch 42 is set in advance such that the relationship $$Vref1 = (Rref2 + Rref3)/(Rref1 + Rref2 + Rref3) \times Vref > C2/C1 \quad (16)$$

may be established from above expression (13), following expression (17) may be established.

$$Vx' - Vx = C1/(C1+C2) \times ((Vref1 - VSS) - C2/C1 \times (Vref - VSS)) > 0 \quad (17)$$

Due thereto, the output OUT of the comparison circuit 14 becomes L level. On the other hand, in this case, if the comparison circuit 14 is not functioning normally, or if the capacitance ratio (C2/C1) of the capacitors C1, C2 does not satisfy expression (16), the relationship $$Vx' - Vx = C1/(C1+C2) \times ((Vref1 - VSS) - C2/C1 \times (Vref - VSS)) < 0 \quad (18)$$

may be established, and the output OUT of the comparison circuit 14 becomes H level.

Next step 414 corresponds to step 312 of the diagnosis operation of the boosting circuit 20 (see FIG. 11), and step 416 corresponds to step 314. When the output OUT of the comparison circuit 14 is L level, the process proceeds to step 418 where, as described above, it is diagnosed that the comparison circuit 14 is operating normally and the capacitance ratio of the capacitors C1, C2 satisfies expression (16). Thereafter, the present operation ends. On the other hand, when the output OUT is H level, the process proceeds to step 420 where, as described above, it is diagnosed that the comparison circuit 14 is not operating normally (abnormal) or that the capacitance ratio of the capacitors C1, C2 does not satisfy expression (16). In subsequent step 422, specific measures are taken, such as operation of the comparison circuit 14 is stopped or the like. Thereafter, comparator diagnosis 1, that is an operation diagnosing the comparing function of the comparison circuit 14, ends.

Figure 17:
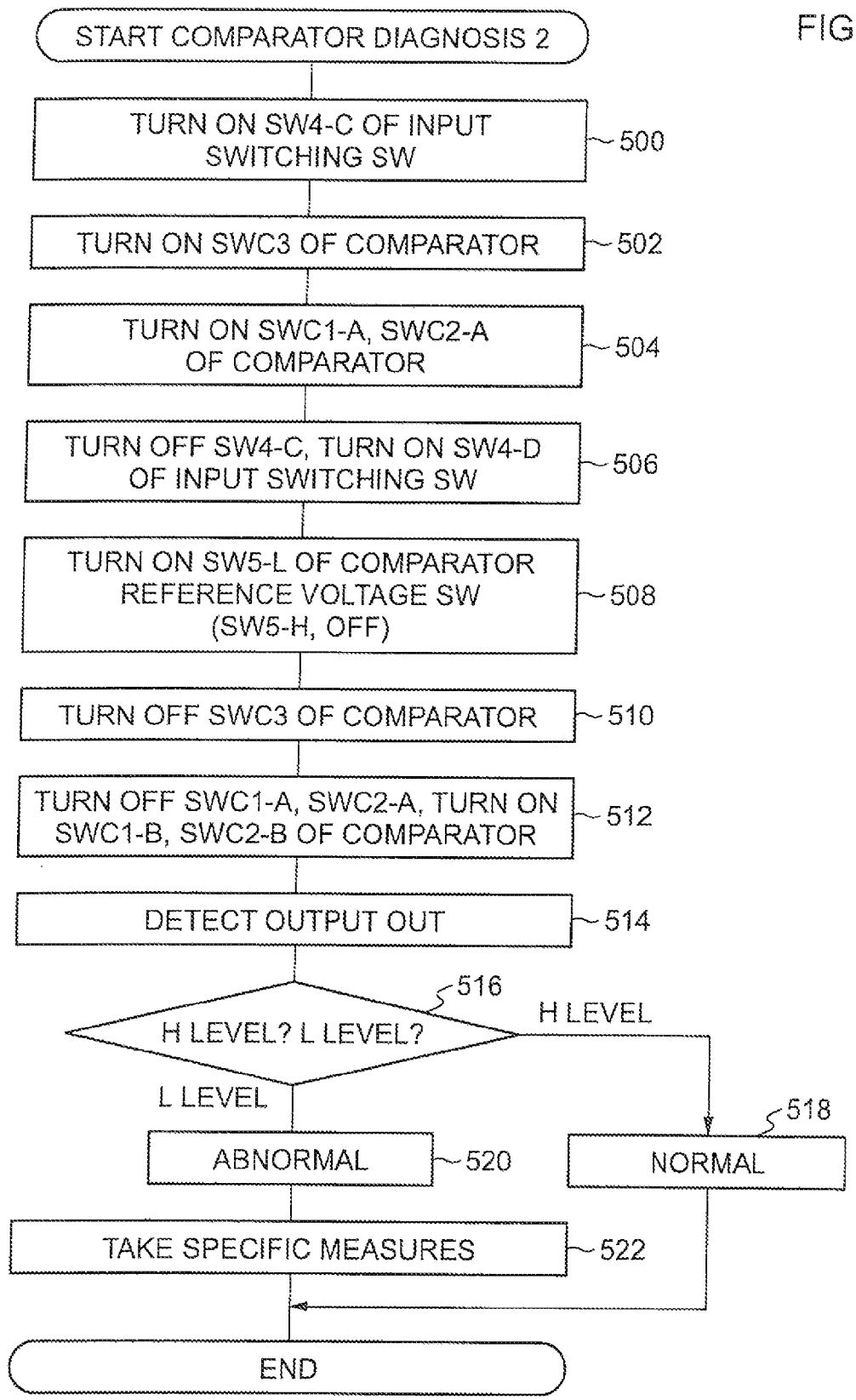
FIG. 17 is a flowchart showing the flow of comparator diagnosing operation 2 according to the second exemplary embodiment.
Figure 18:
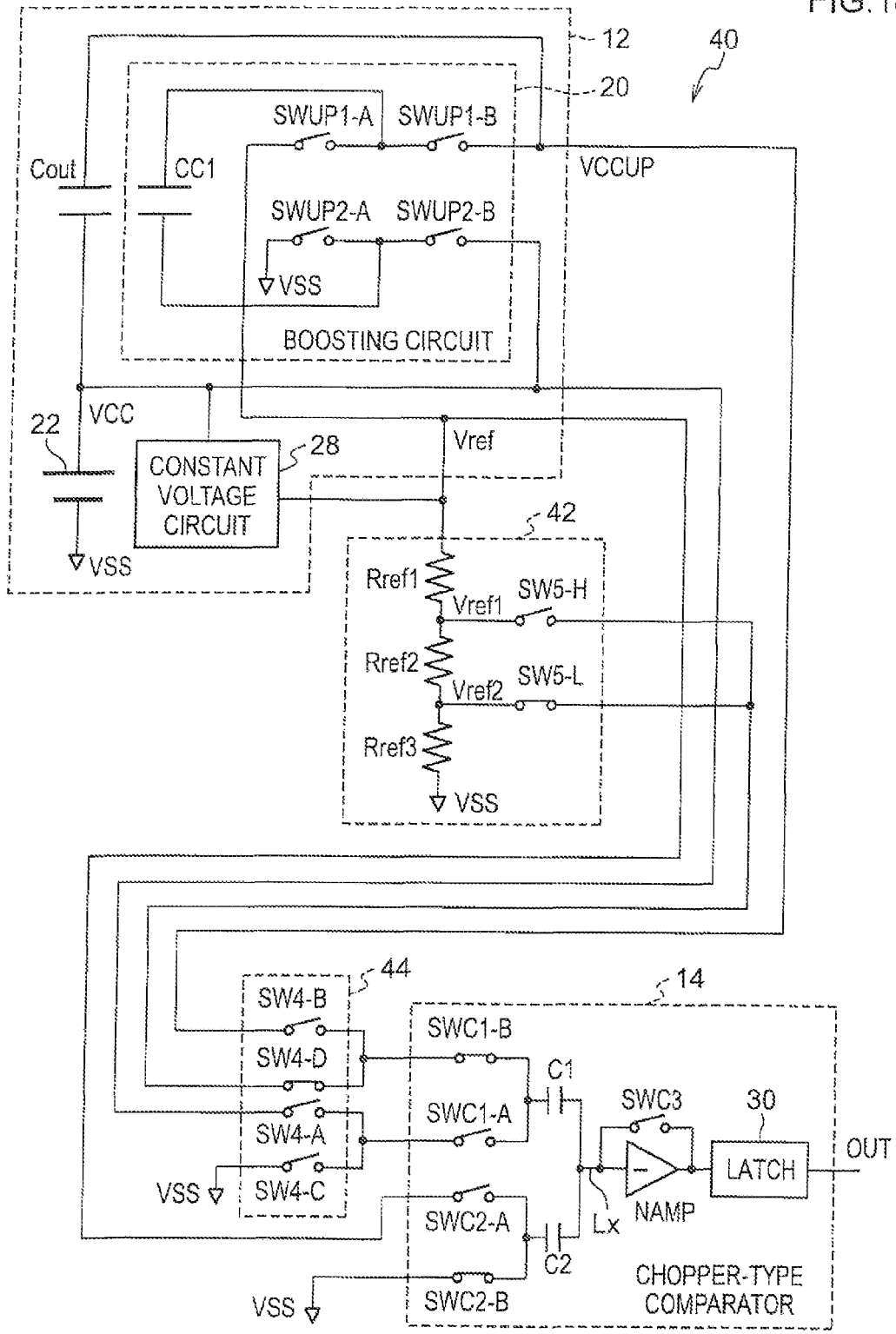
FIG. 18 is a circuit diagram showing the state of the boosting system in comparing operation 2 of the comparator diagnosing operation 1 according to the second exemplary embodiment.

Of the operations of diagnosing the comparing function of the comparison circuit 14 at the boosting system 40 of the present exemplary embodiment, comparator diagnosis 2 (steps 208, 210 of FIG. 10) is described next. Comparator diagnosis 2, that is an operation that diagnoses the comparing function of the comparison circuit 14 of the present exemplary embodiment, is an operation that is substantially similar to the operation of comparator diagnosis 1, and can be divided into an initializing operation and comparing operation 2 (that includes a diagnosing operation in the present exemplary embodiment). A flowchart that is an example of the flow of the overall operation of comparator diagnosis 2, that is a diagnosing operation of the comparing function of the comparison circuit 14 of the present exemplary embodiment, is shown in FIG. 17. Further, a circuit diagram showing the state of the boosting system 40 in comparing operation 2 is shown in FIG. 18. Note that, because the state of the boosting system 40 in the initializing operation is similar to that of comparator diagnosis 1, illustration thereof is omitted (see FIG. 15).

The initializing operation in comparator diagnosis 2 is similar to the initializing operation of comparator diagnosis 1, and step 500 through step 504 correspond respectively to step 400 through step 404 of comparator diagnosis 1 (see FIG. 14). Due to these steps, the difference between the GND voltage VSS and the own threshold voltage Vx (GND voltage VSS−own threshold voltage Vx) charges the capacitor C1. Further, the difference between the constant voltage Vref and the own threshold voltage Vx (constant voltage Vref−own threshold voltage Vx) charges the capacitor C2.

When the initializing operation ends, in next step 506, the switching element SW4-C of the input switching switch 44 is turned OFF, and the switching element SW4-D is turned ON (see FIG. 18). Due thereto, the capacitor C1 of the comparison circuit 14 and the comparator reference voltage switch 42 are connected.

In next step 508, the switching element SW5-L of the comparator reference voltage switch 42 is turned ON. Note that, if the switching element SW5-H is ON at this time, the switching element SW5-H is turned OFF. Due thereto, the reference voltage Vref2, that is obtained by resistance-dividing the constant voltage Vref at the comparator reference voltage switch 42, is outputted to the comparison circuit 14. Note that the reference voltage Vref2 may be expressed by following expression (19).

$$Vref2 = Rref3/(Rref1 + Rref2 + Rref3) \times Vref \quad (19)$$

Next step 510 corresponds to step 410 of comparator diagnosis 1 (see FIG. 14), and step 512 corresponds to step 412. Due to these steps, following expression (20) may be established in the same way as in comparator diagnosis 1, when the voltage of the input signal line Lx at this time is denoted as voltage Vx'.

$$Vx' - Vx = C1/(C1+C2) \times ((Vref2 - VSS) - C2/C1 \times (Vref - VSS)) \quad (20)$$

As described above, when the gain Gnamp is sufficiently high, the output logic of the single inverting amplifier NAMP is determined by the positive/negative sign of voltage Vx'−own threshold voltage Vx. The positive/negative sign of voltage Vx'−own threshold voltage Vx is determined, from above expression (20), by (Vref2−VSS)−C2/C1×(Vref−VSS).

Here, if the resistance ratio (resistance values) of the resistance elements Rref1, Rref2, Rref3 of the comparator reference voltage switch 42 is set in advance such that the relationship $$Vref2 = Rref3/(Rref1 + Rref2 + Rref3) \times Vref < C2/C1 \quad (21)$$

may be established from above expression (19), following expression (22) may be established.

$$Vx' - Vx = C1/(C1+C2) \times ((Vref2 - VSS) - C2/C1 - (Vref - VSS)) < 0 \quad (22)$$

Due thereto, the output OUT of the comparison circuit 14 becomes H level. On the other hand, in this case, if the comparison circuit 14 is not functioning normally, or if the capacitance ratio (C2/C1) of the capacitors C1, C2 does not satisfy expression (21), the relationship $$Vx' - Vx = C1/(C1+C2) \times ((Vref2 - VSS) - C2/C1 \times (Vref - VSS)) > 0 \quad (23)$$

may be established, and the output OUT of the comparison circuit 14 becomes L level.

Next step 514 corresponds to step 412 of comparator diagnosis 1 (see FIG. 14), and step 516 corresponds to step 416. Note that, in comparator diagnosis 2, when the output OUT of the comparison circuit 14 is H level, the process proceeds to step 518 where, as described above, it is diagnosed that the comparison circuit 14 is operating normally and the capacitance ratio of the capacitors C1, C2 satisfies expression (21). Thereafter, the present operation ends. On the other hand, when the output OUT is L level, the process proceeds to step 520 where, as described above, it is diagnosed that the comparison circuit 14 is not operating normally (abnormal) or that the capacitance ratio of the capacitors C1, C2 does not satisfy expression (21). In step 522, specific measures are taken, such as operation of the comparison circuit 14 is stopped or the like. Thereafter, comparator diagnosis 2, that is an operation diagnosing the comparing function of the comparison circuit 14, ends.

The results of the output OUT of the comparison circuit 14 in the present exemplary embodiment are as in Table 2.

TABLE 2

| | boosting circuit diagnosis comparing operation | comparator diagnosis comparing operation 1 | comparator diagnosis comparing operation 2 |
|---|---|---|---|
| no defect | L level | L level | H level |
| there is defect | H level | H level | L level |

As described above, in the boosting system 40 of the present exemplary embodiment, when diagnosis of the boosting circuit 20 is carried out, due to the initializing operation, the difference between the power supply voltage VCC and the own threshold voltage Vx (power supply voltage VCC−own threshold voltage Vx) charges the capacitor C1 of the comparison circuit 14, and the difference between voltage of the constant voltage Vref and the own threshold voltage Vx (constant voltage−own threshold voltage Vx) charges the capacitor C2. In the comparing operation, the boosting section 12 and the capacitor C1 are connected such that the boosted voltage VCCUP is inputted, and GND and the capacitor C2 are connected such that the GND voltage VSS is inputted. In the boosting system 40 of the present exemplary embodiment, if the output OUT is L level, it is diagnosed that there is no defect with the boosting circuit 20, whereas if the output OUT is H level, it is diagnosed that there is defect.

Further, when carrying out diagnosing of the comparing function of the comparison circuit 14, due to the initializing operation, the difference between the GND voltage VSS and the own threshold voltage Vx (GND voltage VSS−own threshold voltage Vx) charges the capacitor C1 of the comparison circuit 14, and the difference between voltage of the constant voltage Vref and the own threshold voltage Vx (constant voltage Vref−own threshold voltage Vx) charges the capacitor C2. In comparator diagnosis 1, in comparing operation 1, the comparator reference voltage switch 42 and the capacitor C1 are connected such that the reference voltage Vref1 is inputted, and GND and the capacitor C2 are connected such that the GND voltage VSS is inputted. If the output OUT is L level, it is diagnosed that the comparing function of the comparison circuit 14 is normal. If the output OUT is H level, it is diagnosed that the comparing function is not normal, or that the capacitors C1, C2 do not satisfy a predetermined capacitance ratio. On the other hand, in comparator diagnosis 2, in comparing operation 2, the comparator reference voltage switch 42 and the capacitor C1 are connected such that the reference voltage Vref2 is inputted, and GND and the capacitor C2 are connected such that the GND voltage VSS is inputted. If the output OUT is H level, it is diagnosed that the comparing function of the comparison circuit 14 is normal. If the output OUT is L level, it is diagnosed that the comparing function is not normal, or that the capacitors C1, C2 do not satisfy a predetermined capacitance ratio. Namely, in the boosting system 40 of the present exemplary embodiment, diagnosis of the comparing function of the comparison circuit 14 is carried out by outputting the relative magnitude of the reference voltage Vref1, the reference voltage Vref2 as a logic value (the output OUT).

In this way, in the diagnosis of the boosting circuit 20 of the present exemplary embodiment, the difference value between the boosted voltage VCCUP and the power supply voltage VCC, and the difference value between the constant voltage Vref and the GND voltage VSS, are compared by the comparison circuit 14. Due thereto, in the present exemplary embodiment, it can be diagnosed whether the boosted voltage VCCUP generated at the boosting circuit 20 is an appropriate value (whether or not it has been boosted). Accordingly, in the present exemplary embodiment, diagnosis may be carried out by utilizing hardware structures (circuits), and not using the CPU as in the conventional case. Accordingly, in the present exemplary embodiment, the CPU may not be occupied by diagnosis of the boosting circuit 20 and may be used for other processings.

Further, the current consumed by the output of the boosting circuit 20 in order to diagnose the boosting circuit 20, is the current for charging the capacitors C1, C2 of the comparison circuit 14 at the time of the initializing operation. The current that is consumed by the output of the boosting circuit 20 may be made to be as small, to the extent that the matching of the capacitors C1, C2 does not affect the comparing operation. Therefore, in the present exemplary embodiment, consumption of output current of the boosting circuit 20 in the diagnosis may be suppressed.

Moreover, in the present exemplary embodiment, diagnosing of the comparing function of the comparison circuit 14 can be carried out. Therefore, it is possible to prevent a situation in which diagnosing of defect with the boosting circuit 20 cannot be carried out appropriately because the comparing function of the comparison circuit 14 is not working normally.

Note that, in the above-described second exemplary embodiment, the diagnosis of the comparing function of the comparison circuit 14 is carried out in succession with the diagnosing of defect of the boosting section 12. However, the present invention is not limited thereto, and these respective diagnoses may be carried out separately. Further, the order of comparator diagnosis 1 and comparator diagnosis 2 in the diagnosing of the comparing function of the comparison circuit 14 also is not particularly limited. Note that the diagnosing of the comparing function of the comparator circuit 14 may be carried out by executing either one of comparator diagnosis 1 and comparator diagnosis 2, but diagnosis of the comparing function can be carried out more appropriately by executing both.

In the above second exemplary embodiment, a case in which, in each of the comparing operations (comparing operation 1, comparing operation 2), diagnosis of the comparing function of the comparison circuit 14 is carried out on the basis of the logic value (H level, L level) of the output OUT, and, in each case, specific measures are carried out when there is an abnormality, has been described. However, the present invention is not limited thereto. For example, the logic values of the output OUT may be stored in a storage section 23, and, after both comparing operations end, the comparing function may be diagnosed and the specific measures may be carried out on the basis of the logic values of the output OUT that are stored in the storage section 23.

In the above first exemplary embodiment and second exemplary embodiment, the structure and operations when carrying out diagnosis of the boosting circuit 20 with respect to cases in which the difference value between the power supply voltage VCC and the boosted voltage VCCUP, and the difference value between voltage of the constant voltage Vref and the GND voltage VSS, are compared at the comparison circuit 14, has been described. However, the present invention is not limited thereto. For example, the difference value between the constant voltage Vref and the boosted voltage VCCUP, and the difference value between voltage of the power supply voltage VCC and the GND voltage VSS, may be compared at the comparison circuit 14.

In the above first exemplary embodiment and second exemplary embodiment, a case in which the detecting circuit 16 and the storage section 18 are provided within the boosting system 10, has been described. However, the present invention is not limited thereto. The detecting circuit 16 and the storage section 18 may be formed at the exterior (on another chip). Further, the present invention may be structured such that the function of instructing the detecting circuit 16 to execute diagnosis, and the function of monitoring the logic value stored in the storage section 18 and diagnosing the absence/presence of defect, are provided within the boosting system 10, or these functions may be provided externally (on another chip).

Further, in the above first exemplary embodiment and second exemplary embodiment, a case in which the constant voltage circuit 24 generates the constant voltage Vref on the basis of the power supply 22, has been described. However, the present invention is not limited thereto. However, the above exemplary embodiments may reduce costs as compared with a case in which the constant voltage Vref is generated from another voltage source (other than the power supply 22). Further, the constant voltage circuit 24 does not have to be a circuit that is used only generating the boosted voltage VCCUP of the boosting circuit 20. Constant voltage circuit that generates the reference voltage for another circuit or the like of the boosting system may also generate the boosted voltage VCCUP. In such case, there is no need to provide plural constant voltage circuits, and therefore, the cost of the system as a whole may further be reduced.

What is claimed is:
1. A boosting system comprising:
a boosting section that generates a boosted voltage obtained by boosting a first voltage in accordance with a second voltage outputted from a constant voltage circuit; and
a comparison circuit, to which the boosted voltage, the first voltage, the second voltage and a ground potential are input,
that compares a first difference value with a second difference value and that outputs results of comparison, wherein the first difference value is obtained from a difference between the boosted voltage and the first voltage, the second difference value is obtained from a difference between the second voltage and the ground potential,
wherein the comparison circuit comprises:
a single inverting amplifier;

a first capacitor and a second capacitor that are connected in parallel, wherein an input of the single inverting amplifier is connected to the first capacitor and the second capacitor;

a first switching element that connects the first capacitor and the boosting section such that the first voltage is inputted;

a second switching element that connects the first capacitor and the boosting section such that the boosted voltage is inputted;

a third switching element that connects the second capacitor and the boosting section such that the second voltage is inputted;

a fourth switching element that connects the second capacitor to ground such that the ground potential is inputted; and a fifth switching element that short-circuits the input and an output of the single inverting amplifier.

2. The boosting system of claim 1, comprising:

a reference voltage generating circuit that, on the basis of the second voltage, generates and outputs either of a first reference voltage and a second reference voltage;

a sixth switching element that connects the boosting section and the first switching element connected to the first capacitor, such that the first voltage is inputted;

a seventh switching element that connects the first switching element to ground, such that the ground potential is inputted;

an eighth switching element that connects the boosting section and the second switching element connected to the first capacitor, such that the boosted voltage is inputted; and a ninth switching element that connects the reference voltage generating circuit and the second switching element connected to the first capacitor, such that the first reference voltage or the second reference voltage is inputted.

3. A boosting system comprising:

a boosting section that generates a boosted voltage obtained by boosting a first voltage in accordance with a second voltage outputted from a constant voltage circuit; and a comparison circuit, to which the boosted voltage, the first voltage, the second voltage and a ground potential are input, that compares a third difference value with a fourth difference value and that outputs results of comparison, wherein the third difference value is obtained from a difference between the boosted voltage and the second voltage, the fourth difference value is obtained from a difference between the first voltage and the ground potential, wherein the comparison circuit comprises:

a single inverting amplifier;

a first capacitor and a second capacitor that are connected in parallel, wherein an input of the single inverting amplifier is connected to the first capacitor and the second capacitor;

a first switching element that connects the boosting section and the first capacitor such that the second voltage is inputted;

a second switching element that connects the boosting section and the first capacitor such that the boosted voltage is inputted;

a third switching element that connects the boosting section and the second capacitor such that the first voltage is inputted;

a fourth switching element that connects the second capacitor to ground such that the ground potential is inputted; and a fifth switching element that short-circuits the input and an output of the single inverting amplifier.

4. The boosting system of claim 3, comprising:

a reference voltage generating circuit that, on the basis of the second voltage, generates and outputs either of a first reference voltage and a second reference voltage;

a sixth switching element that connects the boosting section and the first switching element connected to the first capacitor, such that the second voltage is inputted;

a seventh switching element that connects the first switching element to ground, such that the ground potential is inputted;

an eighth switching element that connects the boosting section and the second switching element, connected to the first capacitor, such that the boosted voltage is inputted; and a ninth switching element that connects the reference voltage generating circuit and the second switching element connected to the first capacitor, such that the first reference voltage or the second reference voltage is inputted.

5. The boosting system of claim 1, wherein the constant voltage circuit generates and outputs the second voltage in accordance with the first voltage.

6. The boosting system of claim 1, comprising a detecting circuit that carries out diagnosis of the boosting section on the basis of the output from the comparison circuit.

7. A diagnosing method comprising, in the boosting system according to claim 1:

switching the first switching element ON and connecting the first capacitor and the boosting section, and applying a difference between the first voltage and an own threshold voltage of the single inverting amplifier to the first capacitor, in a state in which the fifth switching element is ON and the input and the output of the single inverting amplifier are short-circuited;

switching the third switching element ON and connecting the second capacitor and the boosting section, and applying a difference between the second voltage and the own threshold voltage of the single inverting amplifier to the second capacitor, in a state in which the fifth switching element is ON and the input and the output of the single inverting amplifier are short-circuited;

switching the second switching element ON and connecting the first capacitor and the boosting section, in a state in which the fifth switching element is OFF; and switching the fourth switching element ON and connecting the first capacitor to the ground, in a state in which the fifth switching element is OFF.

8. A diagnosing method comprising, in the boosting system according to claim 3:

switching the first switching element ON and connecting the first capacitor and the boosting section, and applying a difference between the second voltage and an own threshold voltage of the single inverting amplifier to the first capacitor, in a state in which the fifth switching element is ON and the input and the output of the single inverting amplifier are short-circuited;

switching the third switching element ON and connecting the second capacitor and the boosting section, and applying a difference between the first voltage and the own threshold voltage of the single inverting amplifier to the second capacitor, in a state in which the fifth switching element is ON and the input and the output of the single inverting amplifier are short-circuited;

switching the second switching element ON and connecting the first capacitor and the boosting section, in a state in which the fifth switching element is OFF; and switching the fourth switching element ON and connecting the first capacitor to the ground, in a state in which the fifth switching element is OFF.

9. A diagnosing method comprising, in the boosting system according to claim 2:

diagnosing the boosting section, the diagnosing comprising:

switching the first switching element ON and connecting the first capacitor and the boosting section, and applying a difference between the first voltage and an own threshold voltage of the single inverting amplifier to the first capacitor, in a state in which the fifth switching element is ON and the input and the output of the single inverting amplifier are short-circuited, switching the third switching element ON and connecting the second capacitor and the boosting section, and applying a difference between the second voltage and the own threshold voltage of the single inverting amplifier to the second capacitor, in a state in which the fifth switching element is ON and the input and the output of the single inverting amplifier are short-circuited, switching the second switching element ON and connecting the first capacitor and the boosting section, in a state in which the fifth switching element is OFF, and switching the fourth switching element ON and connecting the first capacitor to the ground, in a state in which the fifth switching element is OFF; and diagnosing the comparison circuit, the diagnosing comprising:

switching the first switching element and the seventh switching element ON and connecting the first capacitor to the ground, and applying a difference between the ground potential and the own threshold voltage of the single inverting amplifier to the first capacitor, in a state in which the fifth switching element is ON and the input and the output of the single inverting amplifier are short-circuited, switching the third switching element ON and connecting the second capacitor and the boosting section, and applying a difference between the second voltage and the own threshold voltage of the single inverting amplifier to the second capacitor, in a state in which the fifth switching element is ON and the input and the output of the single inverting amplifier are short-circuited, switching the second switching element and the ninth switching element ON and connecting the first capacitor and the boosting section such that the first reference voltage is inputted to the first capacitor, in a state in which the fifth switching element is OFF, switching the fourth switching element ON and connecting the first capacitor to the ground, in a state in which the fifth switching element is OFF, switching the second switching element and the ninth switching element ON and connecting the first capacitor and the boosting section such that the second reference voltage is inputted to the first capacitor, in a state in which the fifth switching element is OFF, and, switching the fourth switching element ON and connecting the first capacitor to the ground, in a state in which the fifth switching element is OFF.

10. A diagnosing method comprising, in the boosting system according to claim 4:

diagnosing the boosting section, the diagnosing comprising:

switching the first switching element ON and connecting the first capacitor and the boosting section, and applying a difference between the second voltage and an own threshold voltage of the single inverting amplifier to the first capacitor, in a state in which the fifth switching element is ON and the input and the output of the single inverting amplifier are short-circuited, switching the third switching element ON and connecting the second capacitor and the boosting section, and applying a difference between the first voltage and the own threshold voltage of the single inverting amplifier to the second capacitor, in a state in which the fifth switching element is ON and the input and the output of the single inverting amplifier are short-circuited, switching the second switching element ON and connecting the first capacitor and the boosting section, in a state in which the fifth switching element is OFF, and switching the fourth switching element ON and connecting the first capacitor to the ground, in a state in which the fifth switching element is OFF; and diagnosing the comparison circuit, the diagnosing comprising:

switching the first switching element and the seventh switching element ON and connecting the first capacitor to the ground, and applying a difference between the ground potential and the own threshold voltage of the single inverting amplifier to the first capacitor, in a state in which the fifth switching element is ON and the input and the output of the single inverting amplifier are short-circuited, switching the third switching element ON and connecting the second capacitor and the boosting section, and applying a difference between the second voltage and the own threshold voltage of the single inverting amplifier to the second capacitor, in a state in which the fifth switching element is ON and the input and the output of the single inverting amplifier are short-circuited, switching the second switching element and the ninth switching element ON and connecting the first capacitor and the boosting section such that the first reference voltage is inputted to the first capacitor, in a state in which the fifth switching element is OFF, switching the fourth switching element ON and connecting the first capacitor to the ground, in a state in which the fifth switching element is OFF, switching the second switching element and the ninth switching element ON and connecting the first capacitor and the boosting section such that the second reference voltage is inputted to the first capacitor, in a state in which the fifth switching element is OFF, and, switching the fourth switching element ON and connecting the first capacitor to the ground, in a state in which the fifth switching element is OFF.

11. A non-transitory computer readable medium storing a diagnosing program for causing a computer to execute a process for self-diagnosing the boosting section of the boosting system according to claim 1, the process comprising:
  switching the first switching element ON and connecting the first capacitor and the boosting section, and applying a difference between the first voltage and an own threshold voltage of the single inverting amplifier to the first capacitor, in a state in which the fifth switching element is ON and the input and the output of the single inverting amplifier are short-circuited;
  switching the third switching element ON and connecting the second capacitor and the boosting section, and applying a difference between the second voltage and the own threshold voltage of the single inverting amplifier to the second capacitor, in a state in which the fifth switching element is ON and the input and the output of the single inverting amplifier are short-circuited;
  switching the second switching element ON and connecting the first capacitor and the boosting section, in a state in which the fifth switching element is OFF; and
  switching the fourth switching element ON and connecting the first capacitor to the ground, in a state in which the fifth switching element is OFF.

12. A non-transitory computer readable medium storing a diagnosing program for causing a computer to execute a process for self-diagnosing the boosting section of the boosting system according to claim 3, the process comprising:
  switching the first switching element ON and connecting the first capacitor and the boosting section, and applying a difference between the second voltage and an own threshold voltage of the single inverting amplifier to the first capacitor, in a state in which the fifth switching element is ON and the input and the output of the single inverting amplifier are short-circuited;
  switching the third switching element ON and connecting the second capacitor and the boosting section, and applying a difference between the first voltage and the own threshold voltage of the single inverting amplifier to the second capacitor, in a state in which the fifth switching element is ON and the input and the output of the single inverting amplifier are short-circuited;
  switching the second switching element ON and connecting the first capacitor and the boosting section, in a state in which the fifth switching element is OFF; and
  switching the fourth switching element ON and connecting the first capacitor to the ground, in a state in which the fifth switching element is OFF.

13. A non-transitory computer readable medium storing a diagnosing program for causing a computer to execute a process for self-diagnosing the boosting section and the comparison circuit of the boosting system according to claim 2, the process comprising:
  diagnosing the boosting section, the diagnosing comprising:
    switching the first switching element ON and connecting the first capacitor and the boosting section, and applying a difference between the first voltage and an own threshold voltage of the single inverting amplifier to the first capacitor, in a state in which the fifth switching element is ON and the input and the output of the single inverting amplifier are short-circuited,
    switching the third switching element ON and connecting the second capacitor and the boosting section, and applying a difference between the second voltage and the own threshold voltage of the single inverting amplifier to the second capacitor, in a state in which the fifth switching element is ON and the input and the output of the single inverting amplifier are short-circuited,
    switching the second switching element ON and connecting the first capacitor and the boosting section, in a state in which the fifth switching element is OFF, and
    switching the fourth switching element ON and connecting the first capacitor to the ground, in a state in which the fifth switching element is OFF; and
  diagnosing the comparison circuit, the diagnosing comprising:
    switching the first switching element and the seventh switching element ON and connecting the first capacitor to the ground, and applying a difference between the ground potential and the own threshold voltage of the single inverting amplifier to the first capacitor, in a state in which the fifth switching element is ON and the input and the output of the single inverting amplifier are short-circuited,
    switching the third switching element ON and connecting the second capacitor and the boosting section, and applying a difference between the second voltage and the own threshold voltage of the single inverting amplifier to the second capacitor, in a state in which the fifth switching element is ON and the input and the output of the single inverting amplifier are short-circuited,
    switching the second switching element and the ninth switching element ON and connecting the first capacitor and the boosting section such that the first reference voltage is inputted to the first capacitor, in a state in which the fifth switching element is OFF,
    switching the fourth switching element ON and connecting the first capacitor to the ground, in a state in which the fifth switching element is OFF,
    switching the second switching element and the ninth switching element ON and connecting the first capacitor and the boosting section such that the second reference voltage is inputted to the first capacitor, in a state in which the fifth switching element is OFF, and,
    switching the fourth switching element ON and connecting the first capacitor to the ground, in a state in which the fifth switching element is OFF.

14. A non-transitory computer readable medium storing a diagnosing program for causing a computer to execute a process for self-diagnosing the boosting section and the comparison circuit of the boosting system according to claim 4, the process comprising:
  diagnosing the boosting section, the diagnosing comprising:
    switching the first switching element ON and connecting the first capacitor and the boosting section, and applying a difference between the second voltage and an own threshold voltage of the single inverting amplifier to the first capacitor, in a state in which the fifth switching element is ON and the input and the output of the single inverting amplifier are short-circuited,
    switching the third switching element ON and connecting the second capacitor and the boosting section, and applying a difference between the first voltage and the own threshold voltage of the single inverting amplifier to the second capacitor, in a state in which the fifth switching element is ON and the input and the output of the single inverting amplifier are short-circuited,
switching the second switching element ON and connecting the first capacitor and the boosting section, in a state in which the fifth switching element is OFF, and
switching the fourth switching element ON and connecting the first capacitor to the ground, in a state in which the fifth switching element is OFF; and diagnosing the comparison circuit, the diagnosing comprising:
switching the first switching element and the seventh switching element ON and connecting the first capacitor to the ground, and applying a difference between the ground potential and the own threshold voltage of the single inverting amplifier to the first capacitor, in a state in which the fifth switching element is ON and the input and the output of the single inverting amplifier are short-circuited,
switching the third switching element ON and connecting the second capacitor and the boosting section, and applying a difference between the second voltage and the own threshold voltage of the single inverting amplifier to the second capacitor, in a state in which the fifth switching element is ON and the input and the output of the single inverting amplifier are short-circuited,
switching the second switching element and the ninth switching element ON and connecting the first capacitor and the boosting section such that the first reference voltage is inputted to the first capacitor, in a state in which the fifth switching element is OFF,
switching the fourth switching element ON and connecting the first capacitor to the ground, in a state in which the fifth switching element is OFF,
switching the second switching element and the ninth switching element ON and connecting the first capacitor and the boosting section such that the second reference voltage is inputted to the first capacitor, in a state in which the fifth switching element is OFF, and,
switching the fourth switching element ON and connecting the first capacitor to the ground, in a state in which the fifth switching element is OFF.

15. The boosting system of claim 1, comprising:
a detecting circuit that outputs control signals to control the comparison circuit based on an instruction to execute diagnosis from the exterior of the boosting system; and
a storage section that stores the logic values that are outputted from the comparison circuit so as to carry out diagnosis of the boosting section on the basis of the logic values.

16. The boosting system of claim 3, wherein the constant voltage circuit generates and outputs the second voltage in accordance with the first voltage.

17. The boosting system of claim 3, comprising a detecting circuit that carries out diagnosis of the boosting section on the basis of the output from the comparison circuit.

18. The boosting system of claim 3, comprising:
a detecting circuit that outputs control signals to control the comparison circuit based on an instruction to execute diagnosis from the exterior of the boosting system; and
a storage section that stores the logic values that are outputted from the comparison circuit so as to carry out diagnosis of the boosting section on the basis of the logic values.

* * * * *